(12) United States Patent
Park et al.

(10) Patent No.: US 12,550,409 B2
(45) Date of Patent: Feb. 10, 2026

(54) SEMICONDUCTOR DEVICE

(71) Applicant: Samsung Electronics Co., Ltd., Suwon-si (KR)

(72) Inventors: Jongchul Park, Seoul (KR); Hyonwook Ra, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 688 days.

(21) Appl. No.: 17/876,109

(22) Filed: Jul. 28, 2022

(65) Prior Publication Data

US 2023/0116461 A1  Apr. 13, 2023

(30) Foreign Application Priority Data

Oct. 8, 2021 (KR) .................. 10-2021-0134168

(51) Int. Cl.
| | |
|---|---|
| *H10D 84/85* | (2025.01) |
| *H10D 30/67* | (2025.01) |
| *H10D 64/23* | (2025.01) |
| *H10D 84/83* | (2025.01) |

(52) U.S. Cl.
CPC ....... *H10D 64/258* (2025.01); *H10D 30/6735* (2025.01); *H10D 30/6757* (2025.01); *H10D 84/85* (2025.01)

(58) Field of Classification Search
CPC ............... H10D 84/85; H10D 84/0149; H10D 84/0135; H10D 84/0151; H10D 84/0186; H10D 84/0188
See application file for complete search history.

(56) References Cited

U.S. PATENT DOCUMENTS

| | | | |
|---|---|---|---|
| 10,269,787 B2 | 4/2019 | Wang et al. | |
| 10,340,348 B2 | 7/2019 | Huang et al. | |
| 10,930,749 B2 | 2/2021 | Jeon et al. | |
| 2019/0206867 A1* | 7/2019 | Lee ................... | H10D 64/015 |
| 2019/0393324 A1 | 12/2019 | Chen et al. | |
| 2021/0143152 A1 | 5/2021 | Yang | |
| 2021/0193528 A1 | 6/2021 | Tsai et al. | |
| 2022/0328496 A1* | 10/2022 | Kang ................. | H10D 62/121 |

FOREIGN PATENT DOCUMENTS

| | | |
|---|---|---|
| KR | 2019/0081071 A | 7/2019 |
| KR | 10-2020-0029743 A | 3/2020 |

* cited by examiner

*Primary Examiner* — Chad M Dicke
*Assistant Examiner* — Valerie N Newton
(74) *Attorney, Agent, or Firm* — Harness, Dickey & Pierce, P.L.C.

(57) ABSTRACT

A semiconductor device includes a first gate electrode and a second gate electrode which are each on a substrate and extend in a first direction, first and second source/drain patterns spaced apart from the first and second gate electrodes in a second direction which crosses the first direction, and an active contact in common connection with top surfaces of the first source/drain pattern and the second source/drain pattern. The active contact comprises a first portion on the first source/drain pattern and a second portion on the second source/drain pattern. The device includes an insulating separation pattern which extends in the second direction to separate the first gate electrode from the second gate electrode, and the active contact comprises a third portion which extends to a region below a bottom surface of the insulating separation pattern to connect the first and second portions of the active contact to each other.

20 Claims, 29 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0134168, filed on Oct. 8, 2021, in the Korean Intellectual Property Office, the entire contents of which are hereby incorporated by reference.

BACKGROUND

The present inventive concepts relate to a semiconductor device, and for example, to a semiconductor device including a field effect transistor.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

The background description provided here is for the purpose of generally presenting the context of some example embodiments of the inventive concepts. Work of the presently named inventors, to the extent it is described in this background section, as well as aspects of the description that may not otherwise qualify as prior art at the time of filing, are neither expressly nor impliedly admitted as prior art against example embodiments of the inventive concepts.

SUMMARY

An example embodiment of the inventive concepts provides a semiconductor device with improved electric characteristics.

According to an example embodiment of the inventive concepts, a semiconductor device may include a first gate electrode and a second gate electrode each on a substrate. The first gate electrode and the second gate electrode extend in a first direction, and there is a space between the first gate electrode and the second gate electrode in the first direction. The semiconductor device may include a first source/drain pattern, wherein there is a space between the first source/drain pattern and the first gate electrode in a second direction which crosses the first direction, and a second source/drain pattern, wherein there is a space between the second source/drain pattern and the second gate electrode in the second direction. The semiconductor device may include an active contact which extends in the first direction and is in common connection with a top surface of the first source/drain pattern and a top surface of the second source/drain pattern, the active contact including a first portion on the first source/drain pattern and a second portion on the second source/drain pattern. The semiconductor device includes an insulating separation pattern which extends in the second direction and separates the first gate electrode from the second gate electrode. The active contact includes a third portion which extends to a region below a bottom surface of the insulating separation pattern and connects the first and second portions of the active contact to each other.

According to an example embodiment of the inventive concepts, a semiconductor device may include a first gate electrode and a second gate electrode each on a substrate. The first gate electrode and the second gate electrode extend in a first direction, and there is a space between the first gate electrode and the second gate electrode in the first direction. The semiconductor device may include a first source/drain pattern, wherein there is a space between the first source/drain pattern and the first gate electrode in a second direction which crosses the first direction, and a second source/drain pattern, wherein there is a space between the second source/drain pattern and the second gate electrode in the second direction. The semiconductor device may include an active contact which extends in the first direction and is connected in common to top surfaces of the first and second source/drain patterns, and an insulating separation pattern which extends in the second direction to separate the first gate electrode from the second gate electrode. The insulating separation pattern may include a first portion which covers a top surface of the active contact, and a second portion which extends into a region between the first and second gate electrodes. A bottom surface of the second portion of the insulating separation pattern is lower than a bottom surface of the first portion of the insulating separation pattern.

According to an example embodiment of the inventive concepts, a semiconductor device may include a substrate including a PMOSFET region and an NMOSFET region adjacent to each other in a first direction, a first active pattern on the PMOSFET region and a second active pattern on the NMOSFET region, a first source/drain pattern on the first active pattern and a second source/drain pattern on the second active pattern, and a first channel pattern in connection with the first source/drain pattern and a second channel pattern in connection with the second source/drain pattern. Each of the first and second channel patterns include a first semiconductor pattern, a second semiconductor pattern, and a third semiconductor pattern, in a sequential stack arrangement with a space between each adjacent semiconductor pattern. The semiconductor device may include a first gate electrode which extends in the first direction to cross the first active pattern, and a second gate electrode which extends in the first direction to cross the second active pattern. Each of the first and second gate electrodes include a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern. The semiconductor device may include a first gate insulating layer between the first channel pattern and the first gate electrode, a second gate insulting layer between the second channel pattern and the second gate electrode, a first gate spacer on a side surface of the first gate electrode, a second gate spacer on a side surface of the second gate electrode, a first gate capping pattern on a top surface of the first gate electrode, a second gate capping pattern on a top surface of the second gate electrode, a first interlayer insulating layer on the first and second gate capping patterns, and an active contact which extends in the first direction and is in common connection with a top surface of the first source/drain pattern and a top surface of the second source/drain pattern. The active contact may include a first portion on the first source/drain pattern and a second portion on the second source/drain pattern. The semiconductor device may include an insulating separation pattern which extends in a second direction to separate the first gate electrode from the second gate electrode, gate contacts which penetrate the first interlayer insulating layer and each couple with at least one of the first and second gate electrodes, a second interlayer insulating layer on the first interlayer insulating layer, a first metal layer in the second interlayer insulating layer, the first metal layer comprising first interconnection lines each in electrical connection with at least one of the active contacts and the gate contacts, a third interlayer insulating layer on the second interlayer insulating layer, and a second metal layer in the third interlayer insulating layer. The second metal layer may include second interconnection lines each in electrical connection with at least one of the first interconnection lines. The active contact may include a third portion which extends to a region below a bottom surface of the insulating separation pattern and connects the first and second portions of the active contact to each other.

Further areas of applicability of some example embodiments of the inventive concepts will become apparent from the detailed description, the claims, and the drawings. The detailed description and specific examples are intended for purposes of illustration only and are not intended to limit the scope of example embodiments of the inventive concepts.

BRIEF DESCRIPTION OF THE DRAWINGS

In the drawings, reference numbers may be reused to identify similar and/or identical elements.

DETAILED DESCRIPTION

Figure 1:
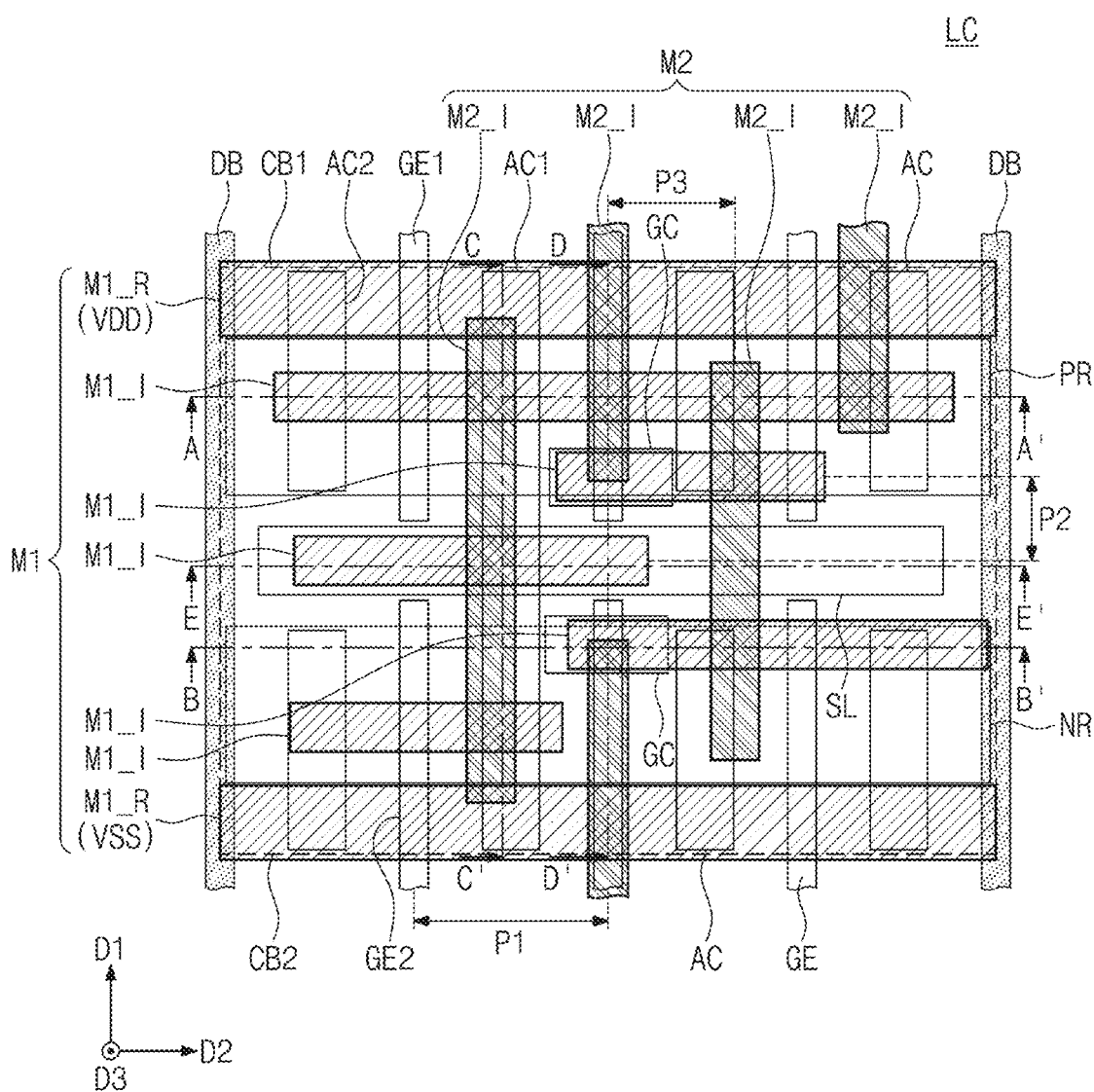
FIG. 1 is a plan view illustrating a semiconductor device according to an example embodiment of the inventive concepts.

FIG. 1 is a plan view illustrating a semiconductor device according to an example embodiment of the inventive concepts. FIGS. 2A to 2E are sectional views taken along lines A-A', B-B', C-C', D-D', and E-E', respectively, of FIG. 1.

Referring to FIGS. 1 and 2A to 2E, a logic cell LC may be provided on a substrate 100. Logic transistors constituting a logic circuit may be disposed on the logic cell LC. The substrate 100 may be a semiconductor substrate, which is formed of or includes silicon, germanium, silicon-germanium, or the like, or a compound semiconductor substrate, but example embodiments are not limited thereto. As an example, the substrate 100 may be a silicon wafer.

The logic cell LC may include a first region PR and a second region NR. The first region PR may be a PMOSFET region, and the second region NR may be an NMOSFET region. The first and second regions PR and NR may be defined by a second trench TR2, which is formed in an upper portion of the substrate 100. The second trench TR2 may be located between the first and second regions PR and NR. The first and second regions PR and NR may be spaced apart from each other in a first direction D1 with the second trench TR2 interposed therebetween.

A first active pattern AP1 and a second active pattern AP2 may be defined by a first trench TR1, which is formed in an upper portion of the substrate 100. The first and second active patterns AP1 and AP2 may be provided on the first and second regions PR and NR, respectively. The first trench TR1 may be shallower than the second trench TR2. In some example embodiments, the first trench TR1 may be omitted, and the first and second active patterns AP1 and AP2 may be defined by the second trench TR2. The first and second active patterns AP1 and AP2 may be extended in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2.

A liner insulating layer may be provided between the device isolation layer ST and the first and second active patterns AP1 and AP2. The liner insulating layer may be conformally provided along the first and second trenches TR1 and TR2. In an example embodiment, the liner insulating layer may be formed of or include SiN or SiON.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which may be sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include silicon (Si), germanium (Ge), or silicon-germanium (SiGe), but example embodiments are not limited thereto. In an example embodiment, each of the first to third semiconductor patterns SP1, SP2, and SP3 may be formed of or include crystalline silicon.

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. Each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. Each pair of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which may be formed by a selective epitaxial growth (SEG) process. In an example embodiment, each of the first and second source/drain patterns SD1 and SD2 may have a top surface that is located at substantially the same or substantially the same level as a top surface of the third semiconductor pattern SP3. In another example embodiment, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In some example embodiments, the pair of the first source/drain patterns SD1 may exert a compressive stress on the first channel patterns CH1 therebetween. The second source/drain patterns SD2 may be formed of or include the same or substantially the same semiconductor material (e.g., Si) as the substrate 100. In an example embodiment, the second source/drain patterns SD2 may be formed of or include single-crystalline silicon.

Each of the first source/drain patterns SD1 may include a first semiconductor layer SEL1 and a second semiconductor layer SEL2, which may be sequentially stacked. A sectional shape of the first source/drain pattern SD1 taken parallel to the second direction D2 will be described with reference to FIG. 2A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. A ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium concentration. In another example embodiment, the first semiconductor layer SEL1 may be provided to contain only silicon (Si) and not germanium (Ge). The germanium concentration of the first semiconductor layer SEL1 may range from 0 at % to 10 at %, but example embodiments are not limited thereto.

The second semiconductor layer SEL2 may be provided to have a relatively high germanium concentration. As an example, the germanium concentration of the second semiconductor layer SEL2 may range from 30 at % to 70 at %, but example embodiments are not limited thereto. The germanium concentration of the second semiconductor layer SEL2 may increase in the third direction D3. For example, the germanium concentration of the second semiconductor layer SEL2 may be about 40 at % near the first semiconductor layer SEL1 and may be about 60 at % at its top level.

The first and second semiconductor layers SEL1 and SEL2 may include impurities (e.g., boron), allowing the first source/drain pattern SD1 to have the p-type conductivity. In an example embodiment, a concentration of impurities in the second semiconductor layer SEL2 (in at %) may be greater than that in the first semiconductor layer SEL1.

Gate electrodes GE may be provided to cross the first and second active patterns AP1 and AP2 and to extend in the first direction D1. The gate electrodes GE may be arranged with a first pitch P1 in the second direction D2. Each of the gate electrodes GE may be vertically overlapped with the first and second channel patterns CH1 and CH2.

The gate electrode GE may include a first portion P01 interposed between the substrate 100 and the first semiconductor pattern SP1, a second portion P02 interposed between the first semiconductor pattern SP1 and the second semiconductor pattern SP2, a third portion P03 interposed between the second semiconductor pattern SP2 and the third semiconductor pattern SP3, and a fourth portion P04 on the third semiconductor pattern SP3.

Referring back to FIG. 2A, the first to third portions P01, P02, and P03 of the gate electrode GE on the first region PR may have different widths from each other. For example, the largest width of the third portion P03 in the second direction D2 may be larger than the largest width of the second portion P02 in the second direction D2. The largest width of the first portion P01 in the second direction D2 may be larger than the largest width of the third portion P03 in the second direction D2.

Referring back to FIG. 2D, the gate electrode GE may be provided on a top surface TS, a bottom surface BS, and opposite side surfaces SW of each of the first to third semiconductor patterns SP1, SP2, and SP3. For example, the logic transistor according to an example embodiment may be a three-dimensional field-effect transistor (e.g., multibridge channel field-effect transistor (MBCFET)), in which the gate electrode GE is provided to surround the channel pattern three-dimensionally.

Referring back to FIGS. 1 and 2A to 2D, a pair of gate spacers GS may be respectively disposed on opposite side surfaces of the fourth portion P04 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar or substantially coplanar with a top surface of a first interlayer insulating layer 110, which will be described below. The gate spacers GS may be formed of or include at least one of SiCN, SiCON, or SiN, but example embodiments are not limited thereto. In an example embodiment, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE and in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN, but example embodiments are not limited thereto.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D).

In an example embodiment, the gate insulating layer GI may include a silicon oxide layer, a silicon oxynitride layer, and/or a high-k dielectric layer, but example embodiments are not limited thereto. The high-k dielectric layer may be formed of or include at least one of high-k dielectric materials whose dielectric constants are higher than that of silicon oxide. As an example, the high-k dielectric materials may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate, but example embodiments are not limited thereto. In another example embodiment, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance, and the paraelectric layer may have a positive capacitance. In some example embodiments where two or more capacitors are connected in series and each capacitor has a positive capacitance, a total capacitance may be less than a capacitance of each of the capacitors. In some example embodiments where at least one of serially-connected capacitors has a negative capacitance, a total capacitance of the serially-connected capacitors may have a positive value and may be greater than an absolute value of each capacitance.

In some example embodiments where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, or any other suitable value, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O), but example embodiments are not limited thereto.

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn), but example embodiments are not limited thereto. The kind of the dopants in the ferroelectric layer may vary depending on a ferroelectric material included in the ferroelectric layer.

In some example embodiments where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In some example embodiments where the dopants are aluminum (Al), a content of aluminum in the ferroelectric layer may range from 3 to 8 at % (atomic percentage), but example embodiments are not limited thereto. Here, the content of the aluminum as the dopants may be a ratio of the number of aluminum atoms to the number of hafnium and aluminum atoms.

In some example embodiments where the dopants are silicon (Si), a content of silicon in the ferroelectric layer may range from 2 at % to 10 at %. In some example embodiments where the dopants are yttrium (Y), a content of yttrium in the ferroelectric layer may range from 2 at % to 10 at %. In some example embodiments where the dopants are gadolinium (Gd), a content of gadolinium in the ferroelectric layer may range from 1 at % to 7 at %. In some example embodiments where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same or substantially the same material. The ferroelectric layer may have the ferroelectric material property, but the paraelectric layer may not have the ferroelectric material property. For example, in some example embodiments where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an example embodiment, the ferroelectric layer may have a thickness ranging from 0.5 to 10 nm, but the inventive concepts are not limited to this example. Since a critical thickness associated with the occurrence of the ferroelectric material property may vary depending on the kind of the ferroelectric material, the thickness of the ferroelectric layer may be changed depending on the kind of the ferroelectric material.

As an example, the gate insulating layer may include a single ferroelectric layer. As another example, the gate insulating layer may include a plurality of ferroelectric layers spaced apart from each other. The gate insulating layer may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and near the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions P01, P02, and P03 of the gate electrode GE may be composed of the first metal pattern including the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N), but example embodiments are not limited thereto. In an example embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta), but example embodiments are not limited thereto. In an example embodiment, the fourth portion P04 of the gate electrode GE may also include the first metal pattern and the second metal pattern on the first metal pattern.

Referring back to FIG. 2B, inner spacers IP may be provided on the second region NR. Each of the inner spacers IP may be interposed between the second source/drain pattern SD2 and a corresponding one of the first to third portions P01, P02, and P03 of the gate electrode GE. The inner spacers IP may be in direct contact with the second source/drain pattern SD2. Each of the first to third portions P01, P02, and P03 of the gate electrode GE may be spaced apart from the second source/drain pattern SD2 by the inner spacer IP. The inner spacer IP will be described in more detail with reference to FIGS. 2A to 2C.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is coplanar or substantially coplanar with the top surface of the gate capping pattern GP and the top surface of the gate spacer GS. A second interlayer insulating layer 120 may be formed on the first interlayer insulating layer 110 to cover the gate capping pattern GP. In an example embodiment, at least one of the first and second interlayer insulating layers 110 and 120 may include a silicon oxide layer.

A pair of division structures DB, which may be opposite to each other in the second direction D2, may be provided at both sides of the logic cell LC. The division structure DB may be extended in the first direction D1 and parallel to the gate electrodes GE. A center-to-center distance between the division structure DB and the gate electrode GE adjacent thereto may be equal to the first pitch P1.

The division structure DB may be provided to penetrate the first and second interlayer insulating layers 110 and 120 and may be extended into the first and second active patterns AP1 and AP2. The division structure DB may penetrate an upper portion of each of the first and second active patterns AP1 and AP2. The division structure DB may separate the first and second regions PR and NR of the logic cell LC from an active region of another logic cell adjacent thereto.

Sacrificial layers SAL adjacent to the division structure DB may be provided on each of the first and second active patterns AP1 and AP2. The sacrificial layers SAL may be stacked to be spaced apart from each other. Each of the sacrificial layers SAL may be located at the same or substantially the same level as a corresponding one of the first to third portions P01, P02, and P03 of the gate electrode GE. The division structure DB may be provided to penetrate the sacrificial layers SAL.

The sacrificial layers SAL may be formed of or include silicon-germanium (SiGe). A germanium concentration of each of the sacrificial layers SAL may range from 10 at % to 30 at %, but example embodiments are not limited thereto. The germanium concentration of the sacrificial layer SAL may be higher than the germanium concentration of the first semiconductor layer SEL1 described above.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extended in the first direction D1.

The active contact AC may be a self-aligned contact. For example, the active contact AC may be formed by a self-alignment process using the gate capping pattern GP and the gate spacer GS. In an example embodiment, the active contact AC may cover at least a portion of a side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

Figure 2A:
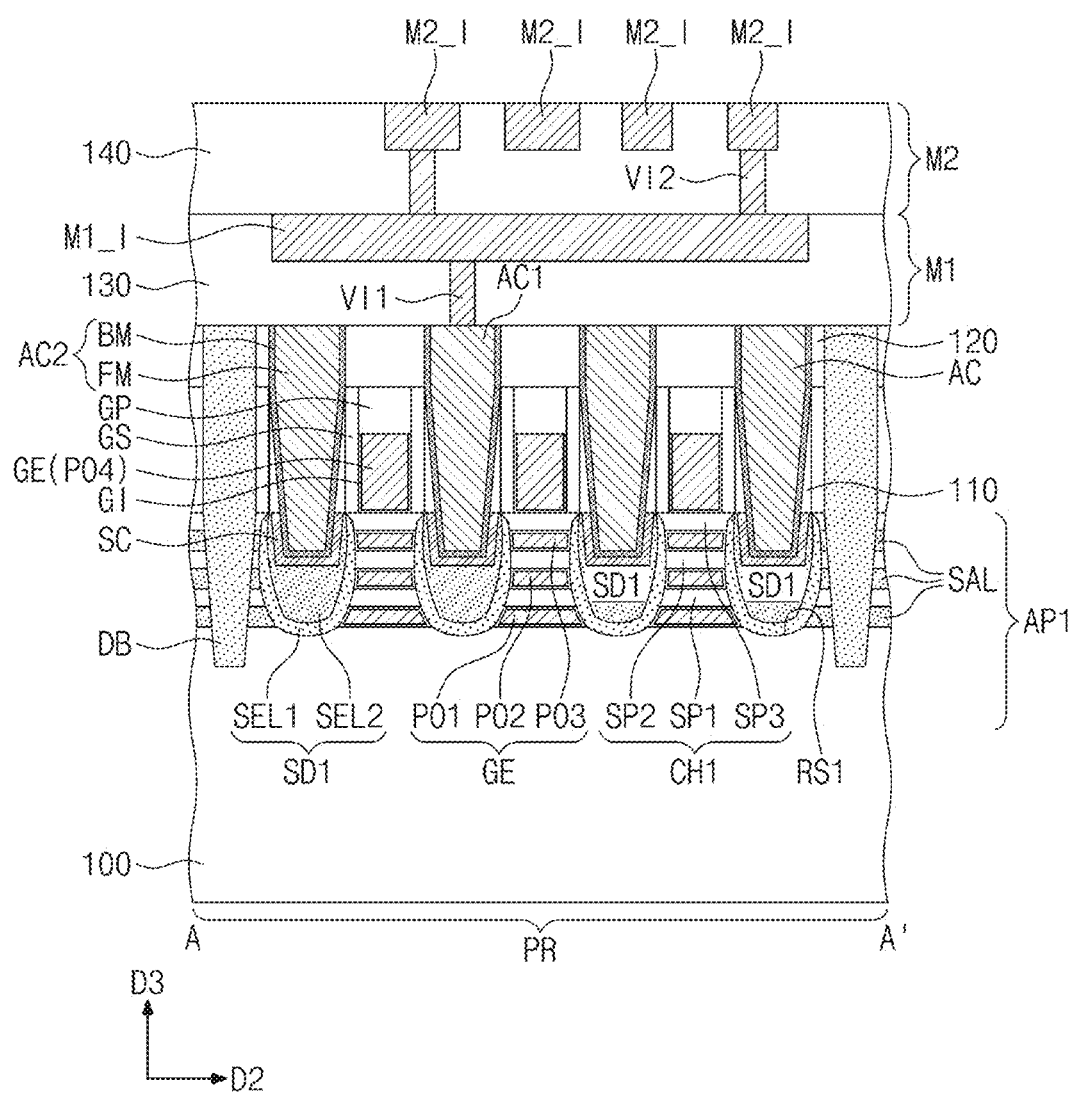
FIGS. 2A to 2E are sectional views taken along lines A-A', B-B', C-C', D-D', and E-E', respectively, of FIG. 1.
Figure 2B:
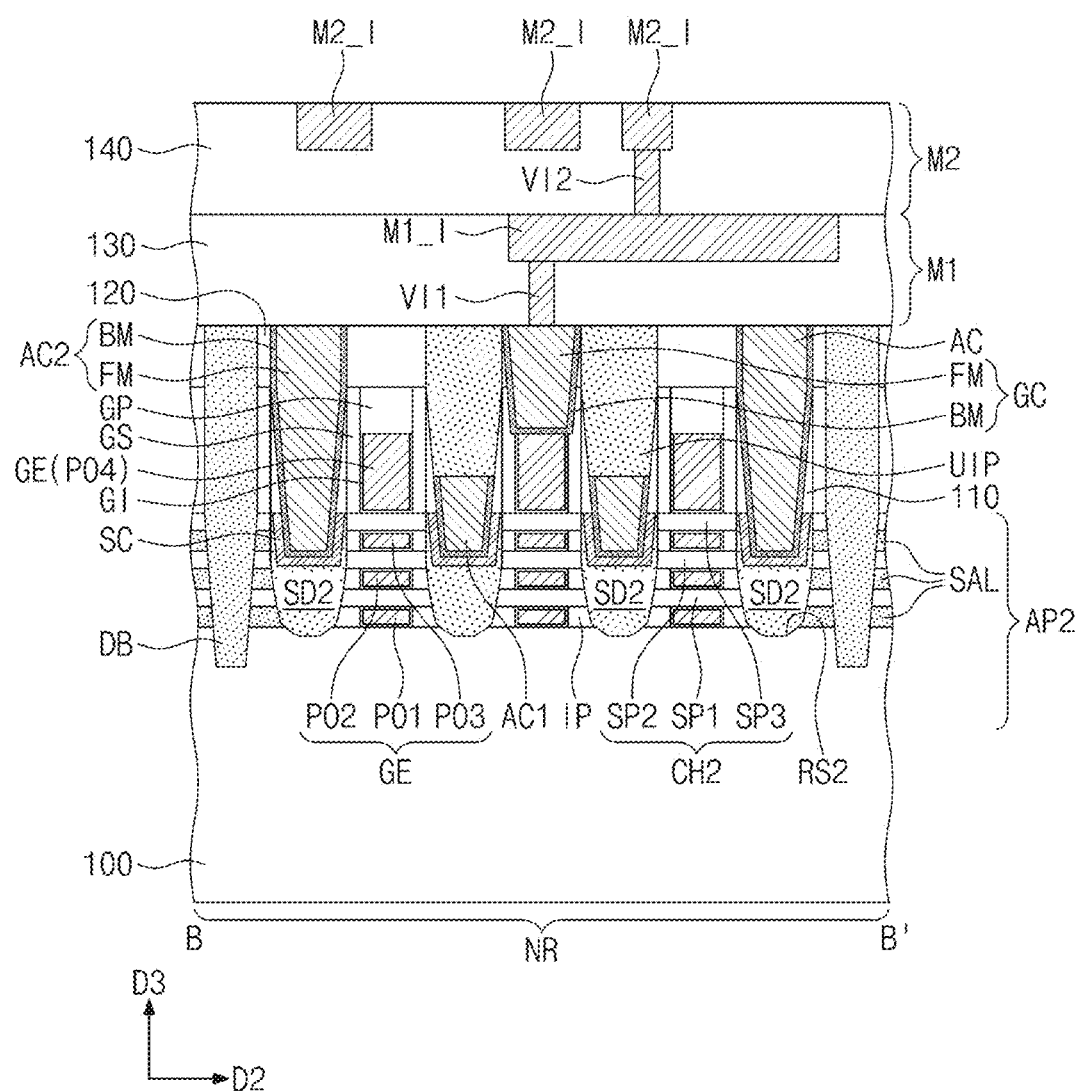

A gate contact GC may be provided to penetrate the second interlayer insulating layer 120 and the gate capping pattern GP and may be electrically connected to the gate electrode GE. Referring to FIG. 2B, a region, which is located on each active contact AC and near the gate contact GC, may be filled with an upper insulating pattern UIP. It may be possible to mitigate or prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In an example embodiment, the barrier pattern BM may include a metal layer and a metal nitride layer. The metal layer may be formed of or include at least one of titanium, tantalum, tungsten, nickel, cobalt, or platinum, but example embodiments are not limited thereto. The metal nitride layer may be formed of or include at least one of titanium nitride (TiN), tantalum nitride (TaN), tungsten nitride (WN), nickel nitride (NiN), cobalt nitride (CoN), or platinum nitride (PtN), but example embodiments are not limited thereto.

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell LC. Each of the first lower interconnection lines M1_R may be a power line. For example, a drain voltage VDD or a source voltage VSS may be applied to the first lower interconnection line M1_R.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line M1_R, to which the drain voltage VDD (e.g., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (e.g., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be arranged in the first direction D1, between the first lower interconnection lines M1_R, to which the drain voltage VDD and the source voltage VSS are respectively applied. Each of the second lower interconnection lines M1_I may be a line- or bar-shaped pattern extended in the second direction D2. The second lower interconnection lines M1_I may be arranged with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and M1_I. The lower vias VI1 may be respectively interposed between the gate contacts GC and the second lower interconnection lines M1_I.

The lower interconnection line M1_R or M1_I of the first metal layer M1 and the lower via VI1 thereunder may be formed by separate processes. Each of the lower interconnection line M1_R or M1_I and the lower via VI1 may be formed by a single damascene process. In an example embodiment, the semiconductor device may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line- or bar-shaped pattern extended in the first direction D1. The upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI2 thereunder may be formed by the same or substantially the same process and may form a single object. For example, the upper interconnection line M2_I of the second metal layer M2 and the upper via VI2 may be formed together by a dual damascene process.

The lower interconnection lines M1_R and M1_I of the first metal layer M1 and the upper interconnection lines M2_I of the second metal layer M2 may be formed of or include the same or substantially the same material or different conductive materials. For example, the lower interconnection lines M1_R and M1_I and the upper interconnection lines M2_I may be formed of or include at least one of metallic materials (e.g., aluminum, copper, tungsten, molybdenum, or cobalt).

In an example embodiment, although not shown, additional metal layers (e.g., M3, M4, M5, and so forth) may be further stacked on the fourth interlayer insulating layer 140. Each of the stacked metal layers may include routing lines.

Hereinafter, a structure of a region including the active contacts AC and the gate electrodes GE will be described in more detail.

The gate electrodes GE may include a first gate electrode GE1 on the first region PR and a second gate electrode GE2 on the second region NR. Each of the first and second gate electrodes GE1 and GE2 may be extended in the first direction D1. The first and second gate electrodes GE1 and GE2 may be spaced apart from each other in the first direction D1. In an example embodiment, one of the first gate electrodes GE1 may be aligned to one of the second gate electrodes GE2 in the first direction D1.

An insulating separation pattern SL may be provided to extend in the second direction D2 and to separate the first gate electrodes GE1 from the second gate electrodes GE2. The insulating separation pattern SL may be provided in a separation trench CC, as shown in FIG. 2D. The insulating separation pattern SL may be provided on a separation region, which may be defined by the second trench TR2 between the first and second regions PR and NR. The insulating separation pattern SL may be in contact with side surfaces of each of the first and second gate electrodes GE1 and GE2 and may be in contact with a side surface of the gate insulating layers GI, as shown in FIG. 2D. The insulating separation pattern SL may be formed of or include a material having an etch selectivity with respect to the first and second interlayer insulating layers 110 and 120. For example, the insulating separation pattern SL may be formed of or include at least one of SiON, SiCN, SiCON, or SiN, but example embodiments are not limited thereto.

Figure 2C:
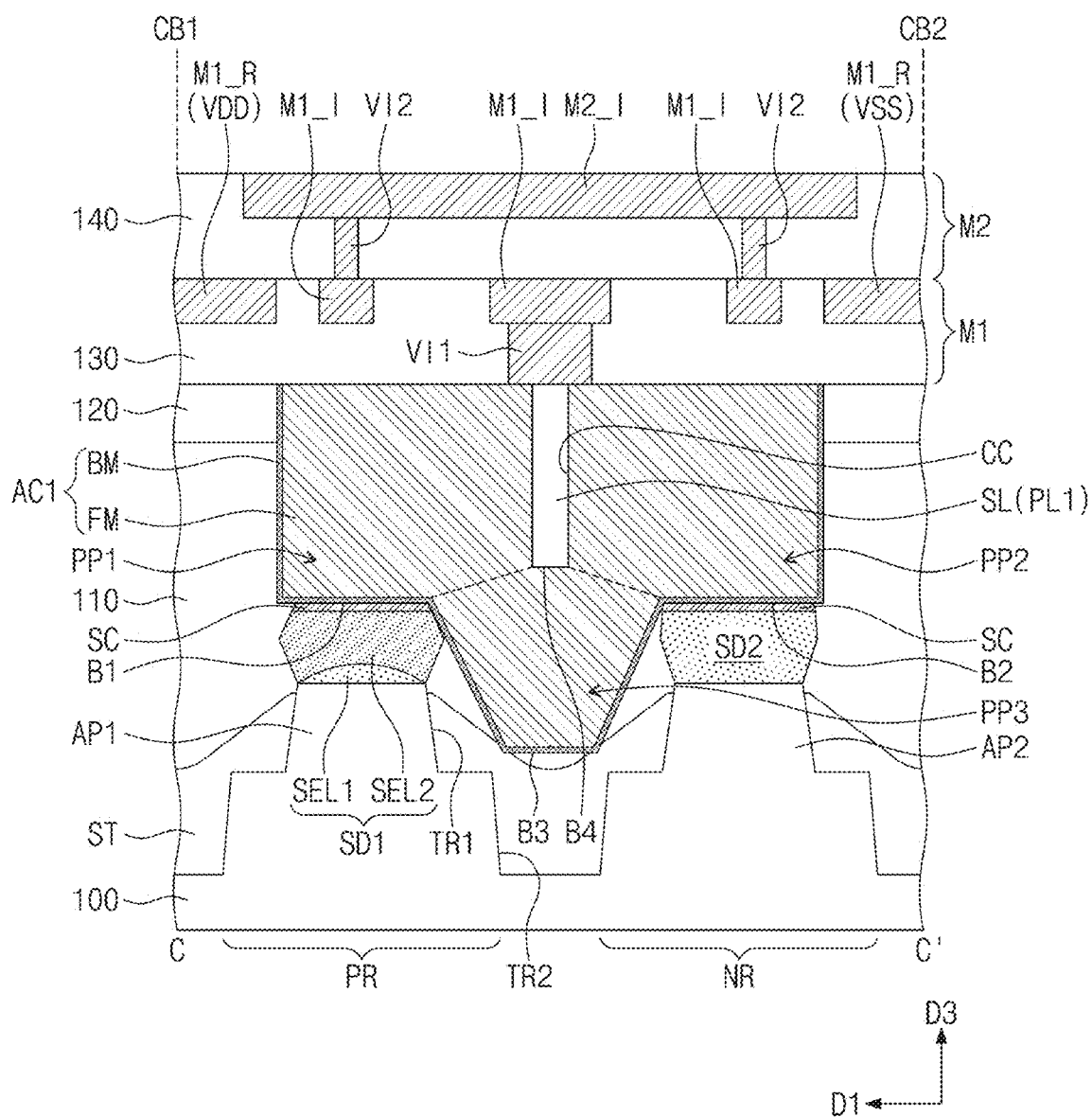
Figure 2D:
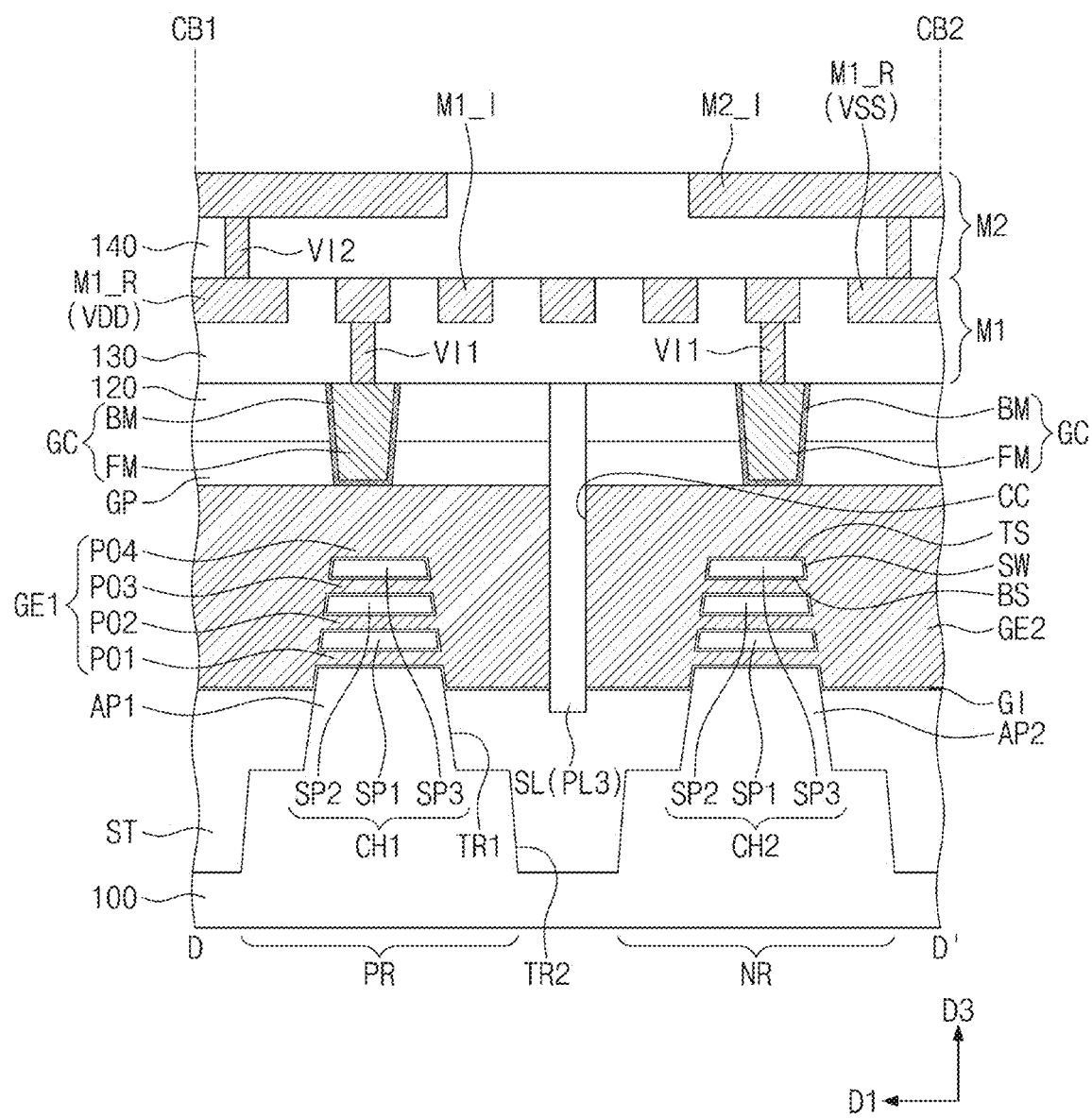
Figure 2E:
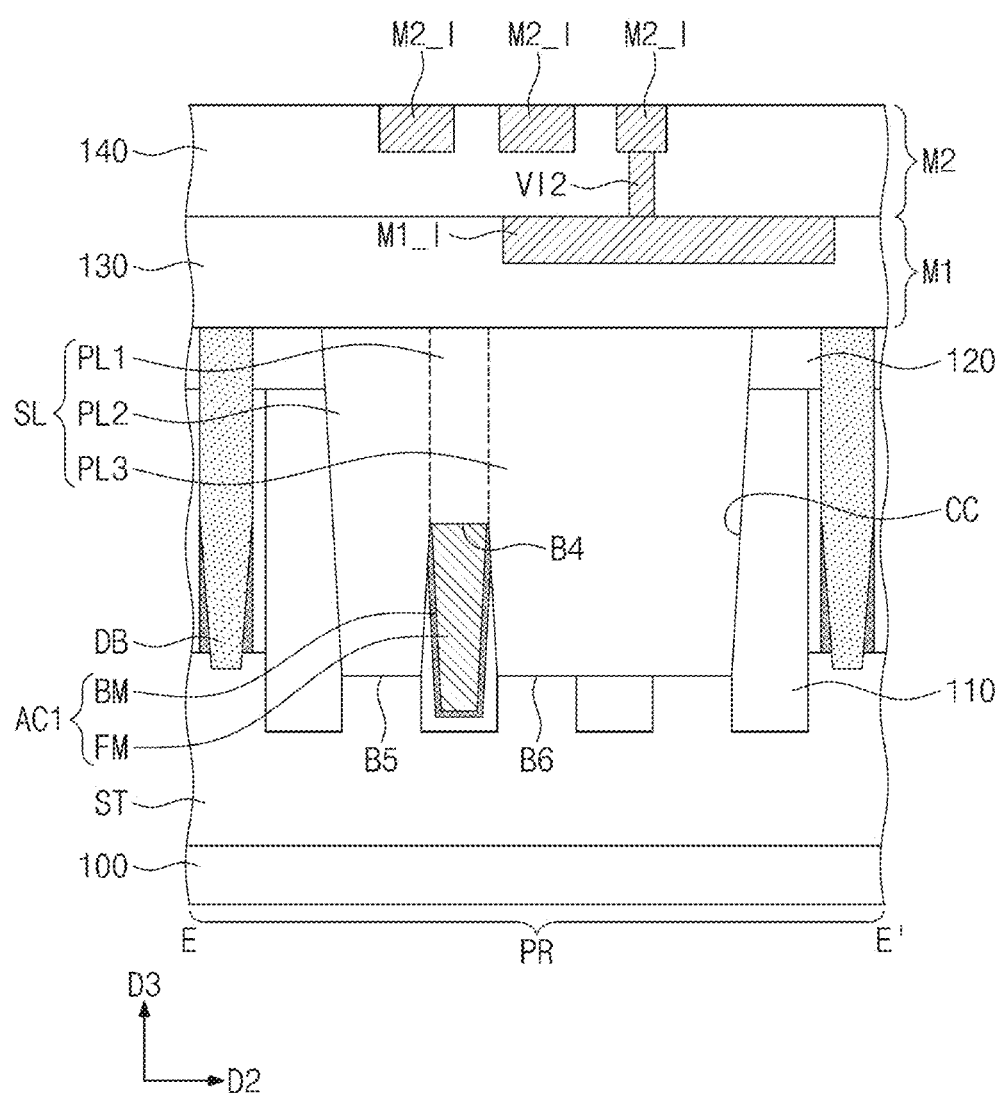

As shown in FIG. 2E, the insulating separation pattern SL may include a first portion PL1, which covers a top surface of a first active contact AC1 to be described below, and a second portion PL2 and a third portion PL3, which do not cover the top surface of the first active contact AC1. The first portion PL1 may be provided between the second portion PL2 and the third portion PL3. Each of the second and third portions PL2 and PL3 may be extended into a region between the first gate electrode GE1 and the second gate electrode GE2. A bottom surface B5 of the second portion PL2 and a bottom surface B6 of the third portion PL3 may be lower than a bottom surface B4 of the first portion PL1.

The active contact AC may include a first active contact AC1 and a second active contact AC2. The second active contact AC2 may be a contact that is locally formed on a single source/drain pattern. For example, the second active contact AC2 may be locally provided on one of the first and second source/drain patterns SD1 and SD2. The first active contact AC1 may be a contact that is connected in common to a plurality of source/drain patterns. For example, the first active contact AC1 may be extended in the first direction D1 to connect the first source/drain pattern SD1 on the first region PR to the second source/drain pattern SD2 on the second region NR. The first active contact AC1 may be extended from the first region PR to the second region NR through the separation region.

As shown in FIG. 2C, the first active contact AC1 may include a first portion PP1 on the first source/drain pattern SD1, a second portion PP2 on the second source/drain pattern SD2, and a third portion PP3 connecting the first portion PP1 to the second portion PP2. Each of the first and second portions PP1 and PP2 may be in contact with one of opposite side surfaces of the insulating separation pattern SL (for example, the first portion PL1). The third portion PP3 may be provided below the first portion PL1 of the insulating separation pattern SL. The first portion PL1 of the insulating separation pattern SL may be overlapped with the third portion PP3 of the first active contact AC1.

A bottom surface B3 of the third portion PP3 may be lower than a bottom surface B1 of the first portion PP1 and a bottom surface B2 of the second portion PP2. The third portion PP3 may be a protruding portion, which is extended from the first and second portions PP1 and PP2 toward the substrate 100. In an example embodiment, the bottom surface B3 of the third portion PP3 may be lower than the bottom surface of the first source/drain pattern SD1 and the bottom surface of the second source/drain pattern SD2. The bottom surface B4 of the first portion PL1 of the insulating separation pattern SL may be higher than the bottom surfaces B1 and B2 of the first and second portions PP1 and PP2 of the first active contact AC1, but the inventive concepts are not limited to this example.

The first active contact AC1 may be connected to at least one of the lower vias VI1. In an example embodiment, the lower via VI1 may be provided to cover a top surface of the first portion PL1 of the insulating separation pattern SL and to connect the first and second portions PP1 and PP2 of the first active contact AC1 to each other. In another example embodiment, the lower via VI1 may be provided on each of the first and second portions PP1 and PP2 of the first active contact AC1. In another example embodiment, the lower via VI1 may be provided on one of the first and second portions PP1 and PP2 of the first active contact AC1.

FIGS. 3A to 12C are sectional views illustrating a method of fabricating a semiconductor device according to an example embodiment of the inventive concepts. In detail, FIGS. 3A to 11A are sectional views corresponding to the line A-A' of FIG. 1. FIGS. 6B to 11B are sectional views corresponding to the line B-B' of FIG. 1. FIGS. 6C to 11C and FIG. 12A are sectional views corresponding to the line C-C' of FIG. 1. FIGS. 3B, 4B, 5B, 6D to 11D, and 12B are sectional views corresponding to the line D-D' of FIG. 1. FIGS. 5C, 6E, 8E, 10E, 11E, and 12C are sectional views corresponding to the line E-E' of FIG. 1.

Figure 3A:
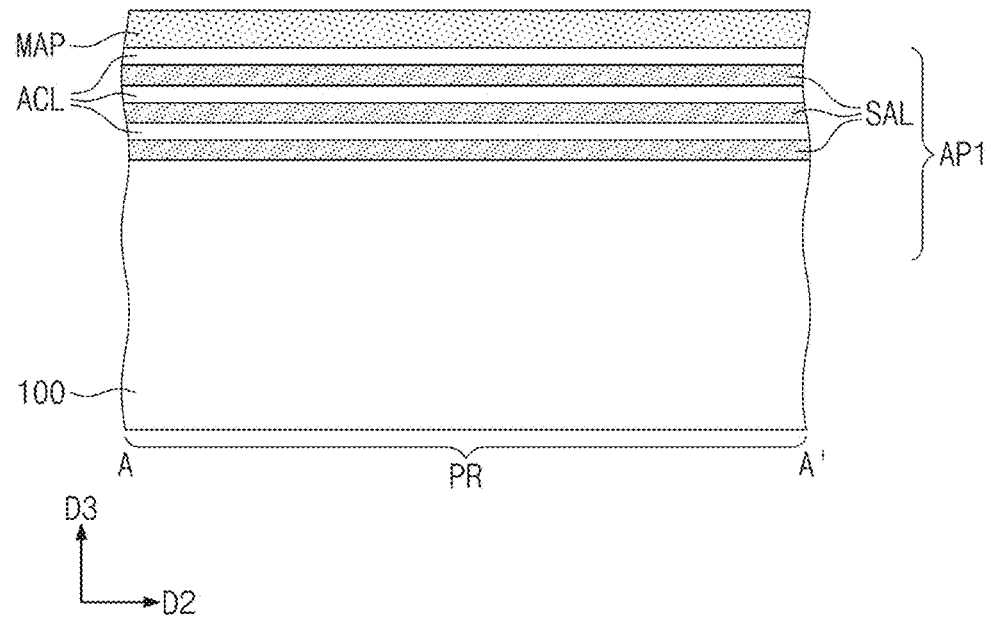
FIGS. 3A and 3B are sectional views corresponding to lines A-A' and D-D', respectively, of FIG. 1, illustrating sacrificial layers and active layers alternately stacked on a substrate according to an example embodiment of the inventive concepts.
Figure 3B:
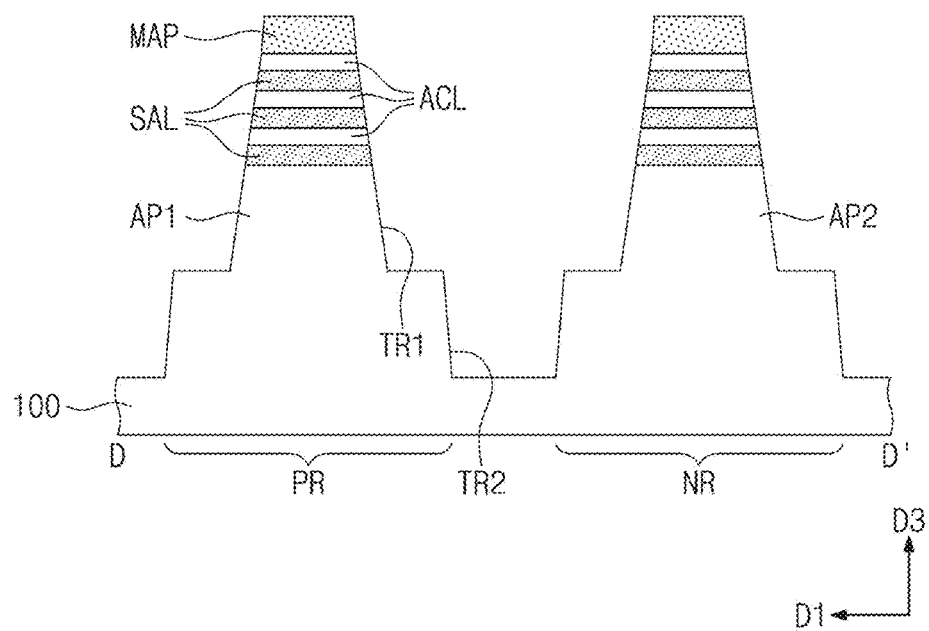

Referring to FIGS. 3A and 3B, the substrate 100 including the first and second regions PR and NR may be provided. Sacrificial layers SAL and active layers ACL may be alternately stacked on the substrate 100. The sacrificial and active layers SAL and ACL may be formed of or include, for example, at least one of silicon (Si), germanium (Ge), or silicon germanium (SiGe), and the material of the active layers ACL may be different from that of the sacrificial layers SAL.

For example, the sacrificial layers SAL may be formed of or include silicon germanium (SiGe), and the active layers ACL may be formed of or include silicon (Si). A germanium concentration of each of the sacrificial layers SAL may range from 10 at % to 30 at %, but example embodiments are not limited thereto.

Mask patterns MAP may be respectively formed on the first and second regions PR and NR of the substrate 100. The mask patterns MAP may be a line- or bar-shaped pattern extended in a second direction D2.

A first patterning process, in which the mask patterns MAP are used as an etch mask, may be performed to form the first trench TR1 defining a first active pattern AP1 and a second active pattern AP2. The first and second active patterns AP1 and AP2 may be formed on the first and second regions PR and NR, respectively. Each of the first and second active patterns AP1 and AP2 may include the sacrificial layers SAL and the active layers ACL, which may be alternately stacked in an upper portion thereof.

A second patterning process may be performed on the substrate 100 to form the second trench TR2 defining the first and second regions PR and NR. The second trench TR2 may be formed to have a depth larger than the first trench TR1. Thereafter, a liner insulating layer may be formed on the substrate 100 to conformally cover the first and second trenches TR1 and TR2. In an example embodiment, the liner insulating layer may be formed of or include SiN or SiON.

Figure 4A:
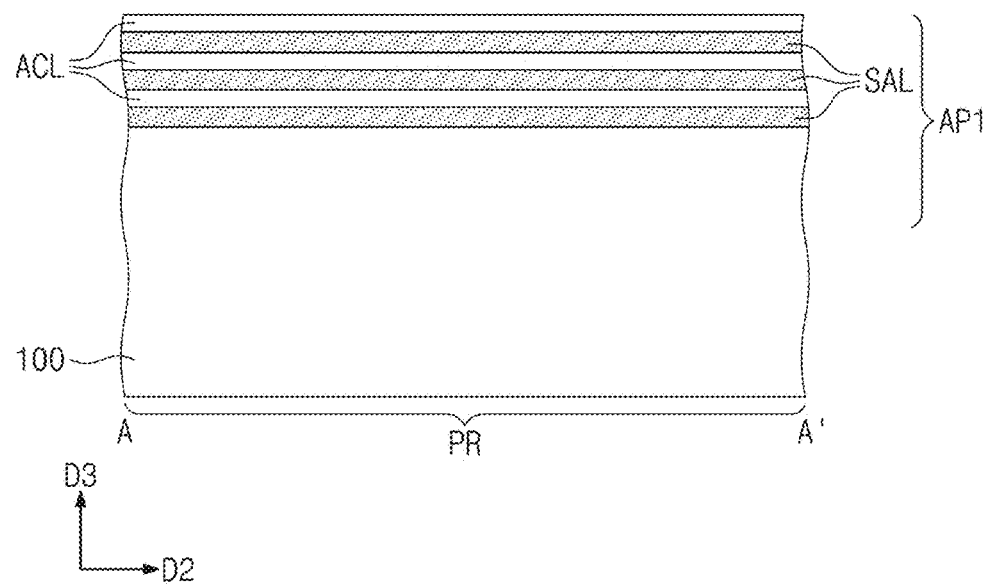
FIGS. 4A and 4B are sectional views corresponding to lines A-A' and D-D', respectively, of FIG. 1, illustrating a device isolation layer formed on a substrate according to an example embodiment of the inventive concepts.
Figure 4B:
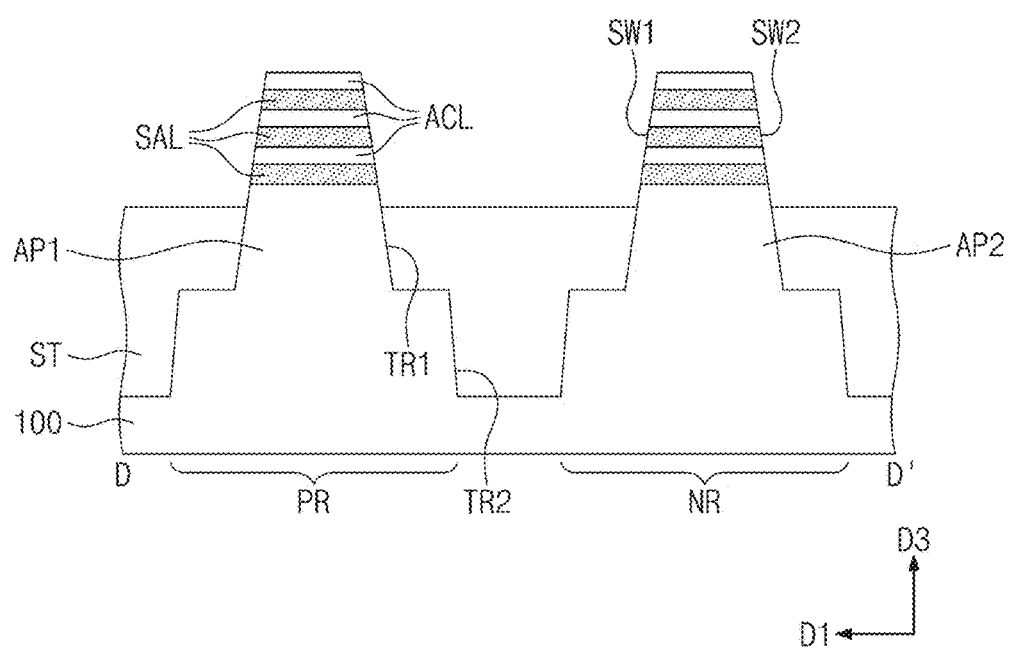

Referring to FIGS. 4A and 4B, the device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed to the outside.

The device isolation layer ST may be formed of or include an insulating material (e.g., silicon oxide). Each of the first and second active patterns AP1 and AP2 may include an upper portion that is exposed to the outside of the device isolation layer ST in an upward direction. For example, the upper portion of each of the first and second active patterns AP1 and AP2 may vertically protrude above the device isolation layer ST. Each of the sacrificial layers SAL and active layers ACL may have opposite side surfaces SW1 and SW2.

Figure 5A:
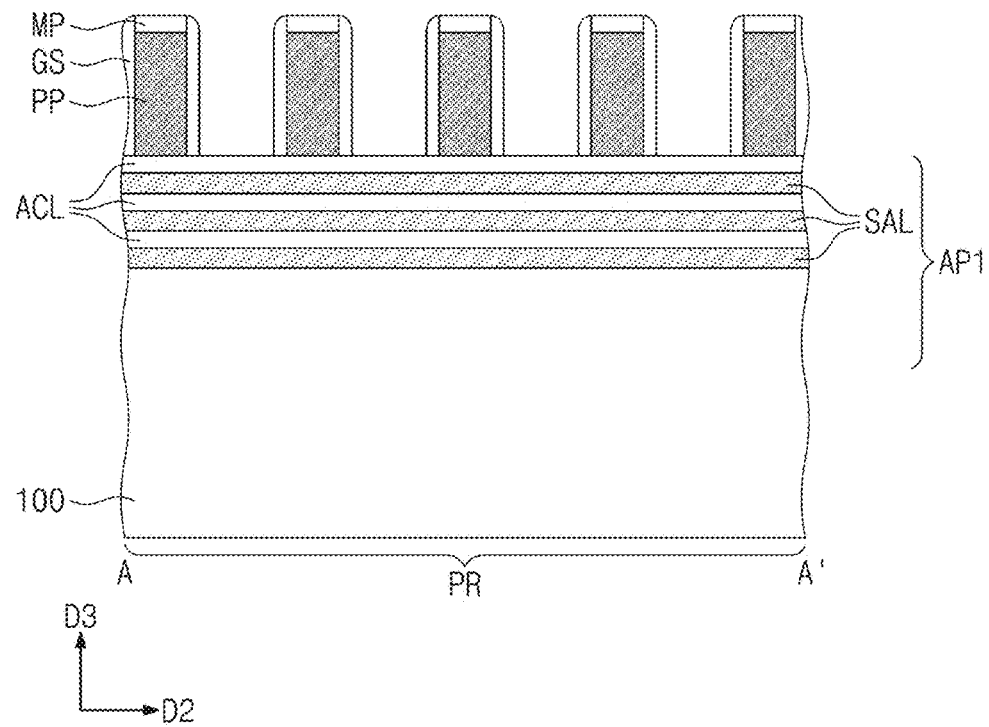
FIGS. 5A to 5C are sectional views corresponding to lines A-A', D-D' and E-E', respectively, of FIG. 1, illustrating sacrificial patterns formed on a substrate according to an example embodiment of the inventive concepts.
Figure 5B:
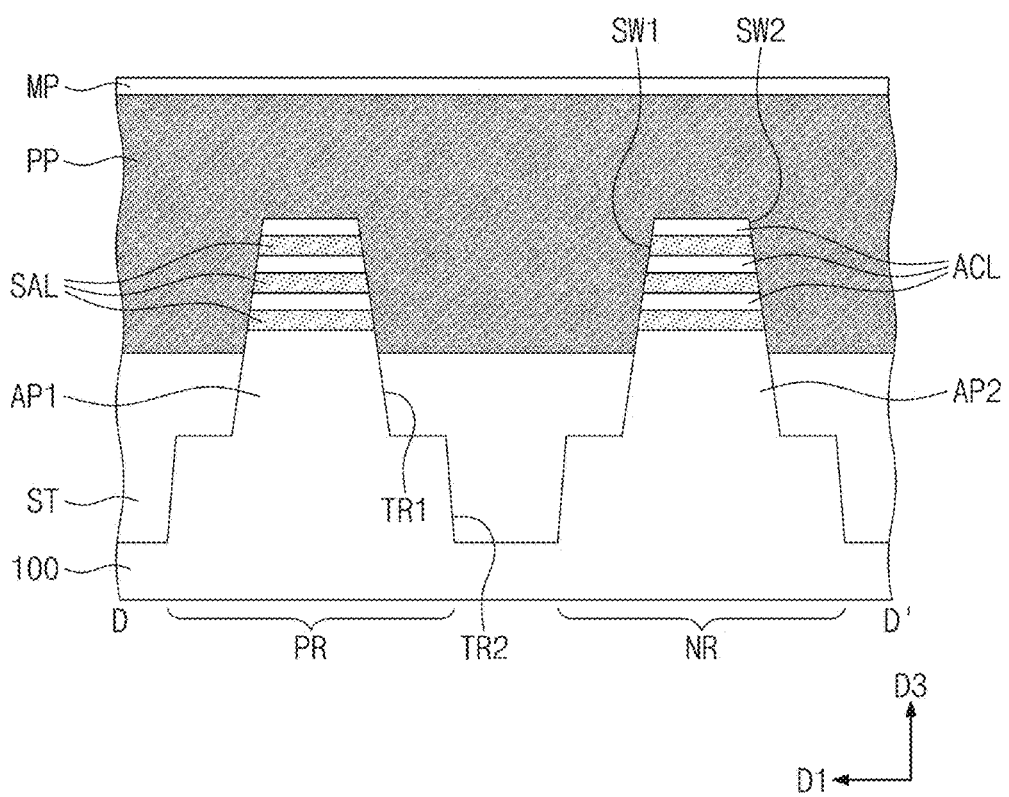
Figure 5C:
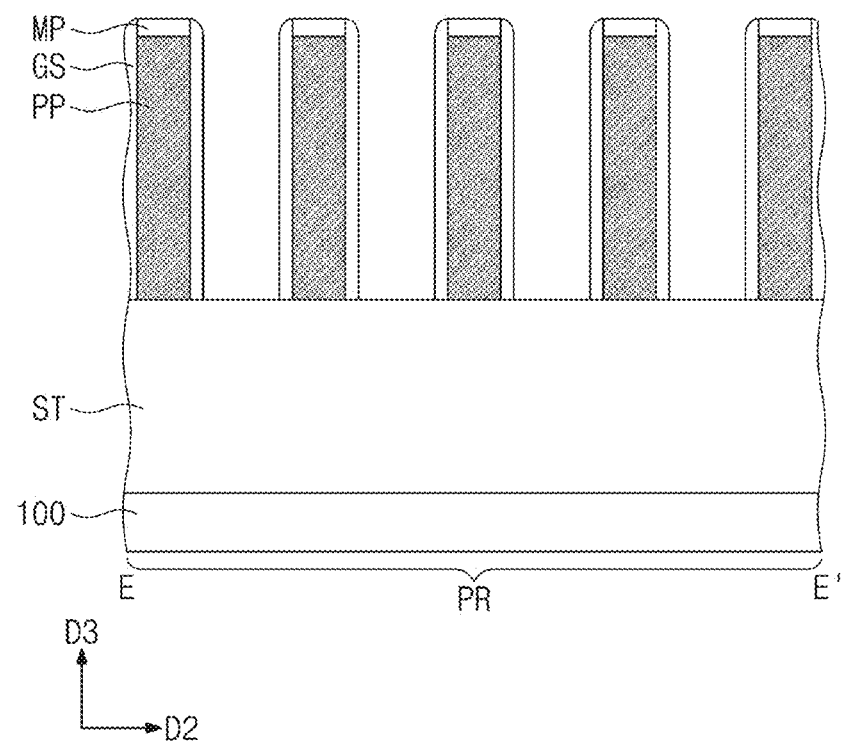
Figure 6A:
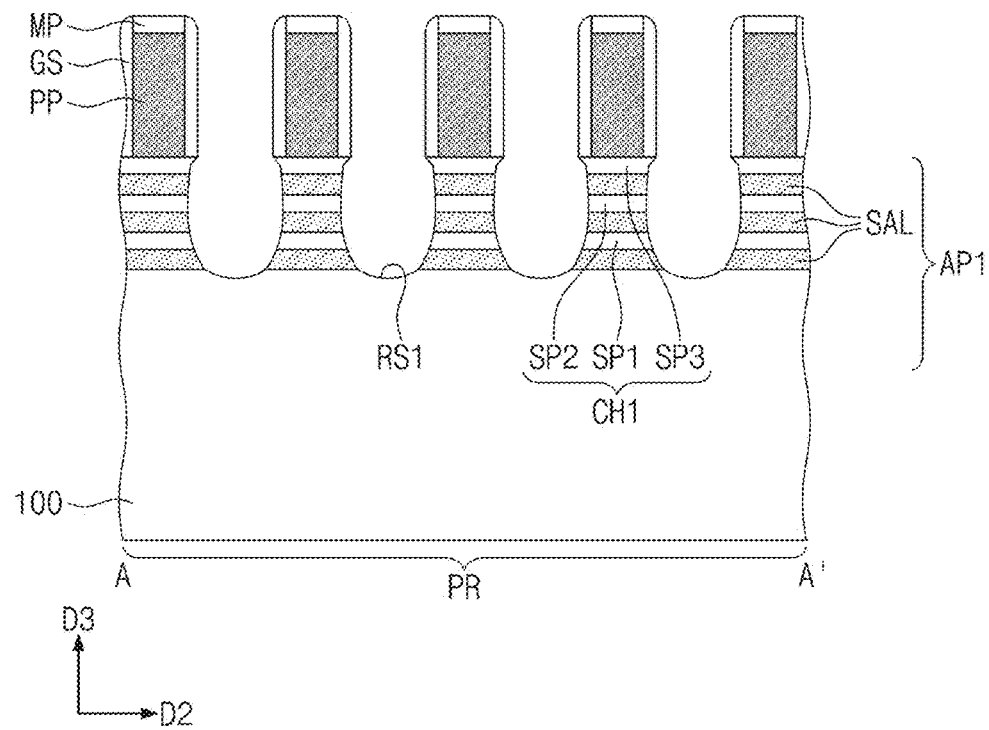
FIGS. 6A to 6E are sectional views corresponding to lines A-A', B-B', C-C' D-D' and E-E', respectively, of FIG. 1, illustrating recesses formed in upper portions of active patterns according to an example embodiment of the inventive concepts.
Figure 6B:
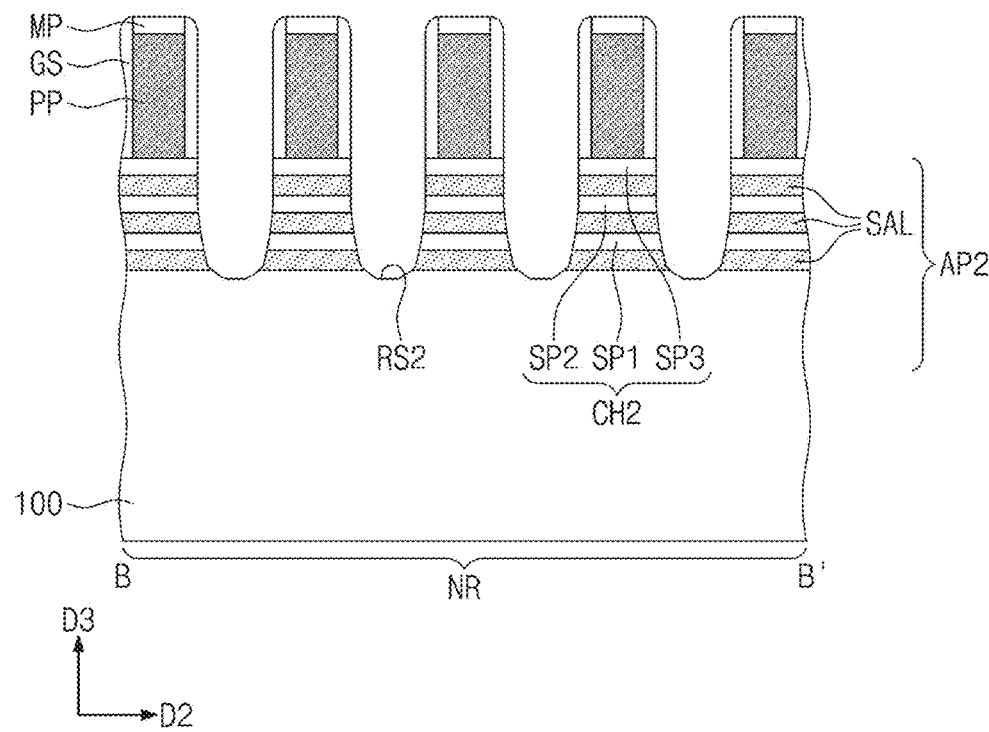
Figure 6C:
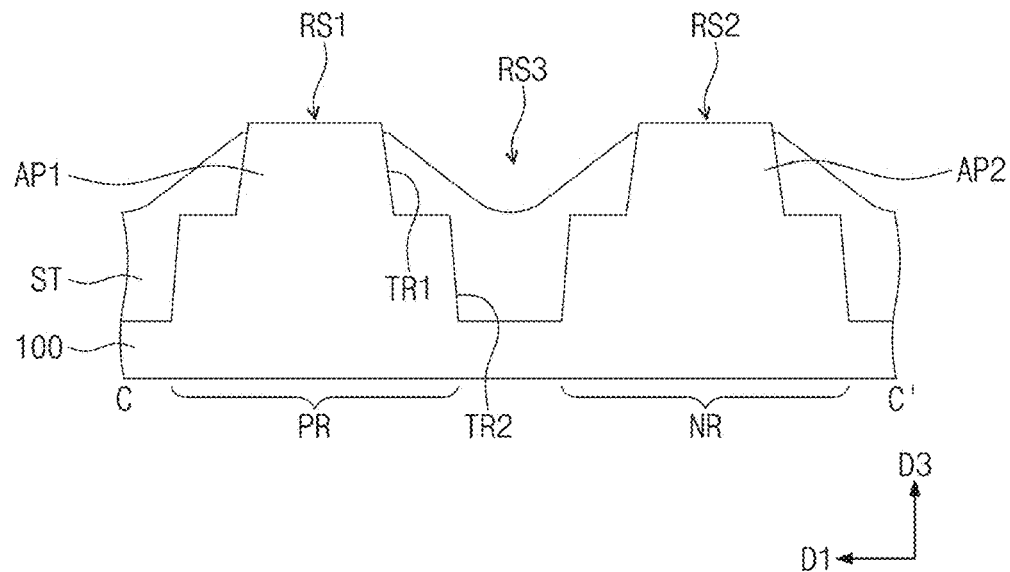
Figure 6D:
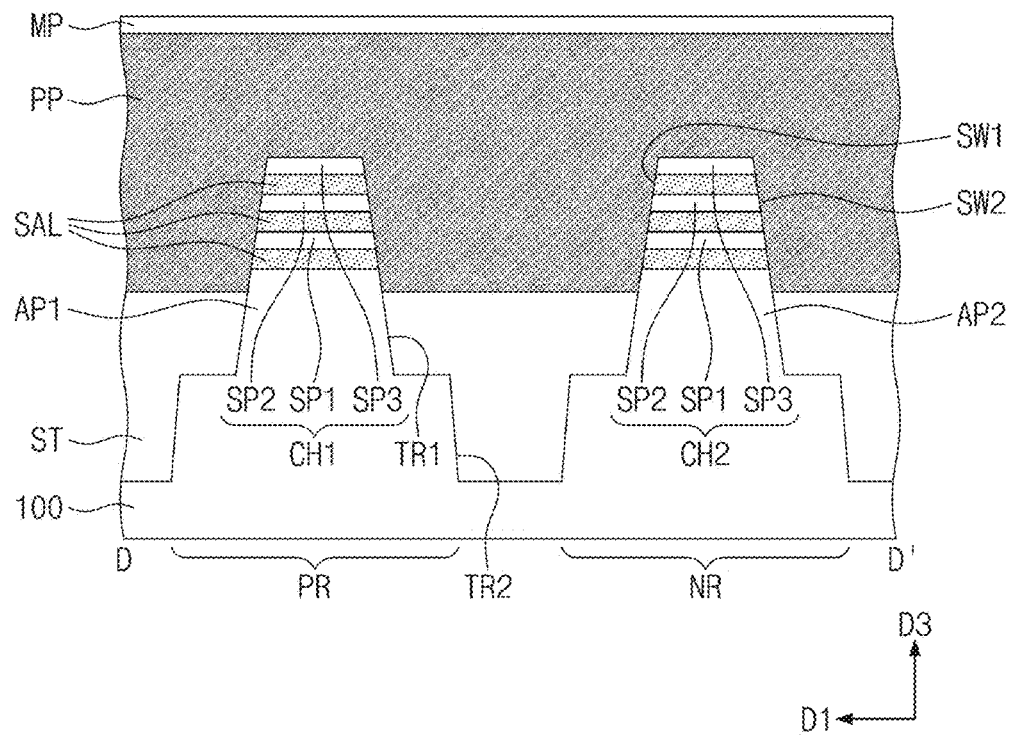
Figure 6E:
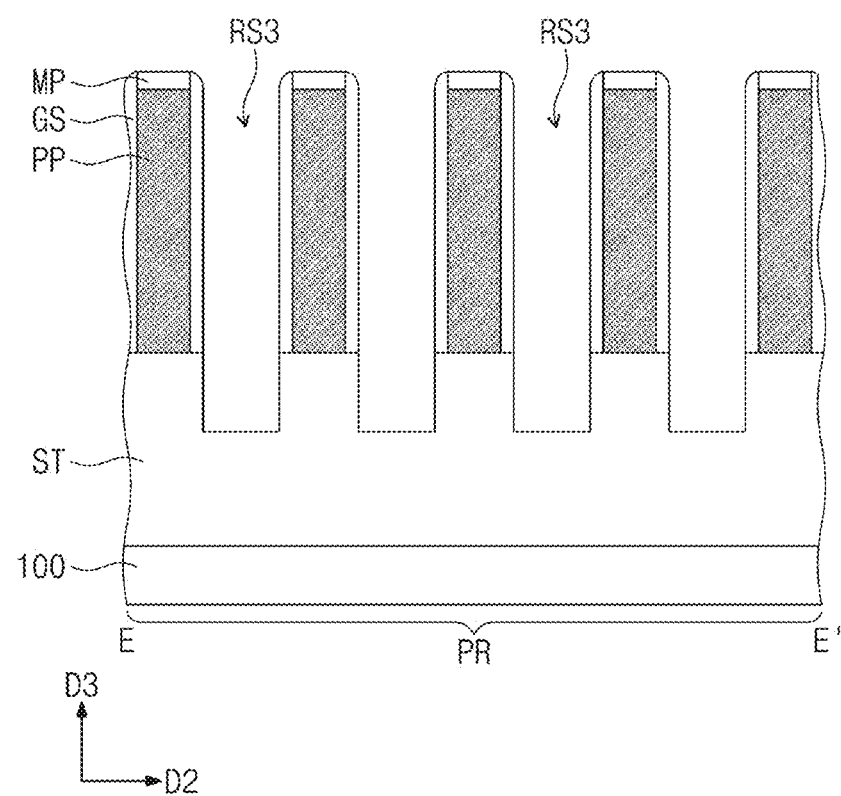
Figure 7A:
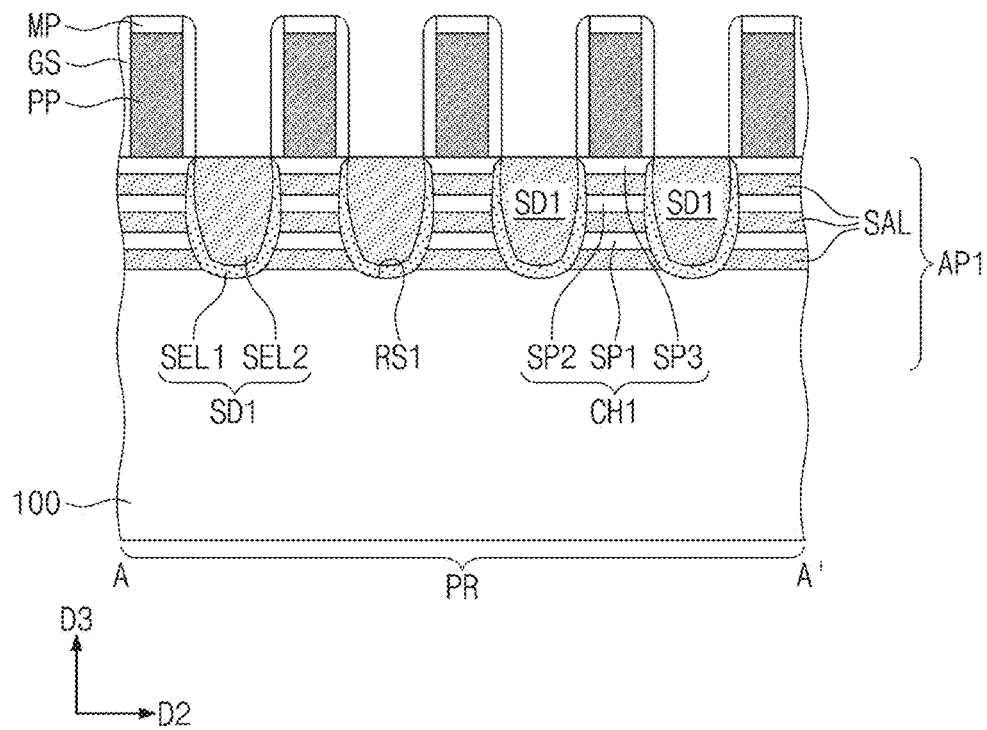
FIGS. 7A to 7D are sectional views corresponding to lines A-A', B-B', C-C' and D-D', respectively, of FIG. 1, illustrating source/drain patterns formed in recesses according to an example embodiment of the inventive concepts.
Figure 7B:
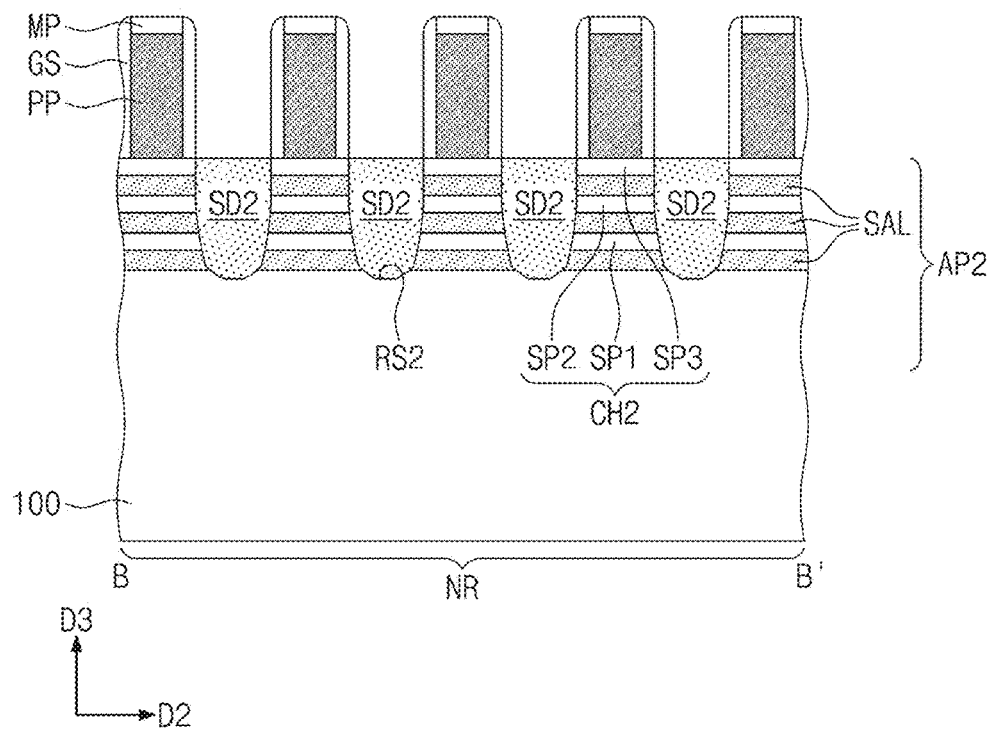
Figure 7C:
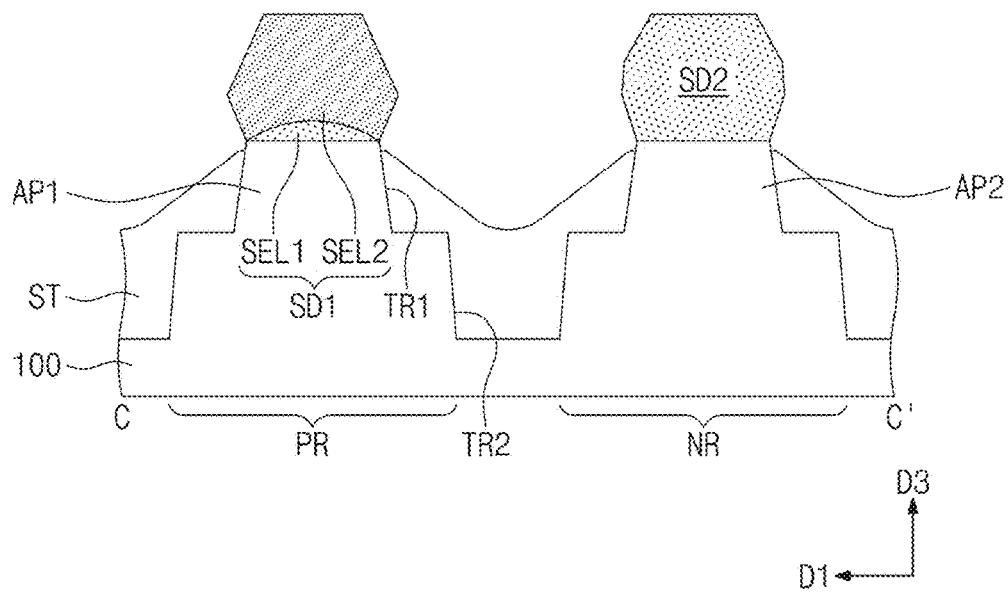
Figure 7D:
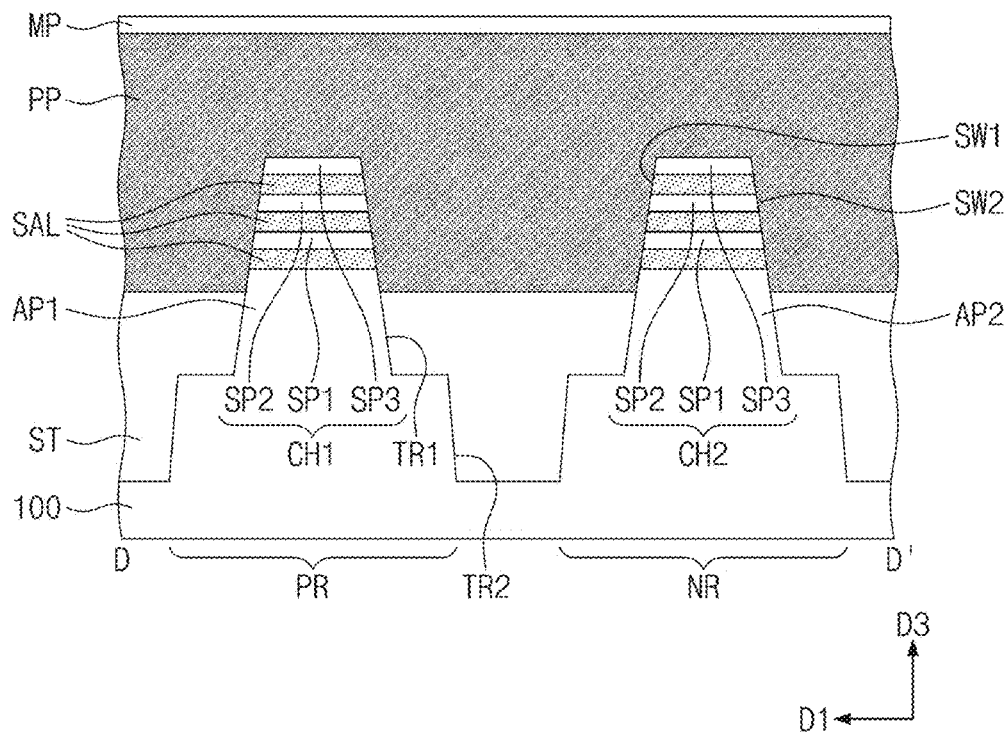
Figure 8A:
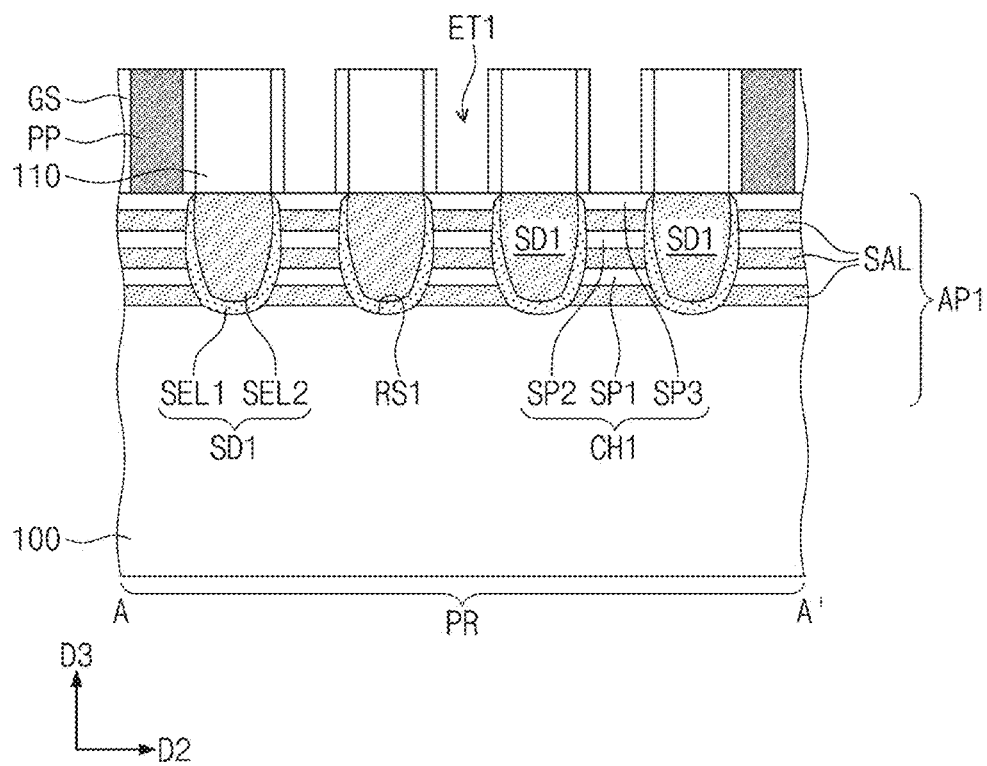
FIGS. 8A to 8E are sectional views corresponding to lines A-A', B-B', C-C' D-D' and E-E', respectively, of FIG. 1, illustrating a first interlayer insulating layer according to an example embodiment of the inventive concepts.
Figure 8B:
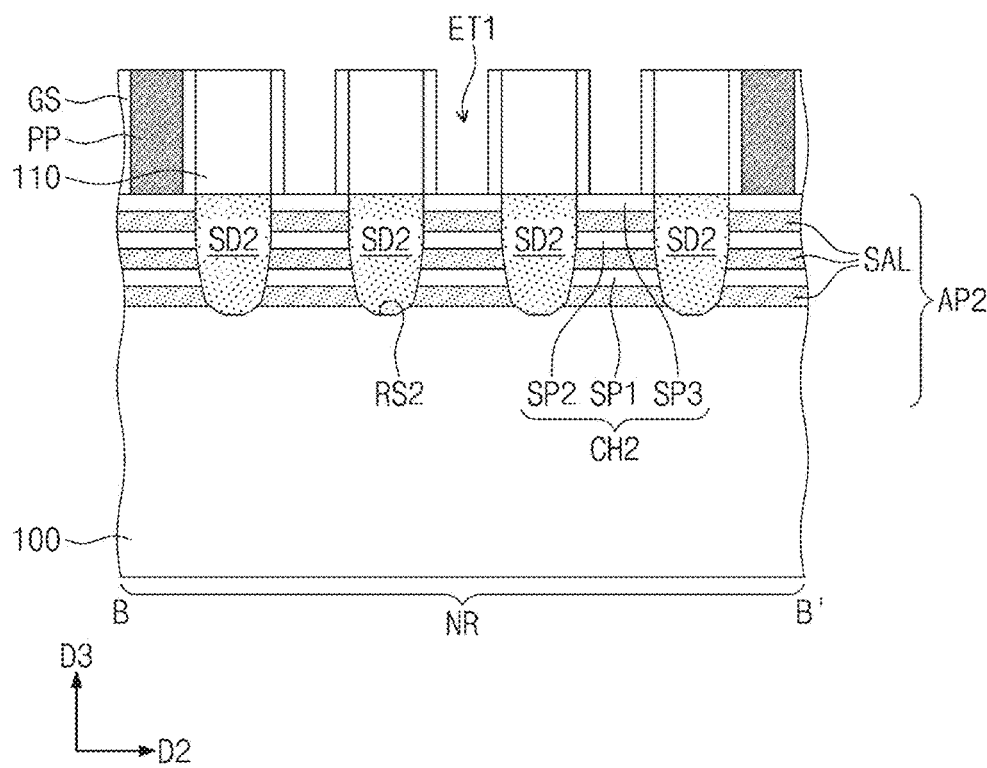
Figure 8C:
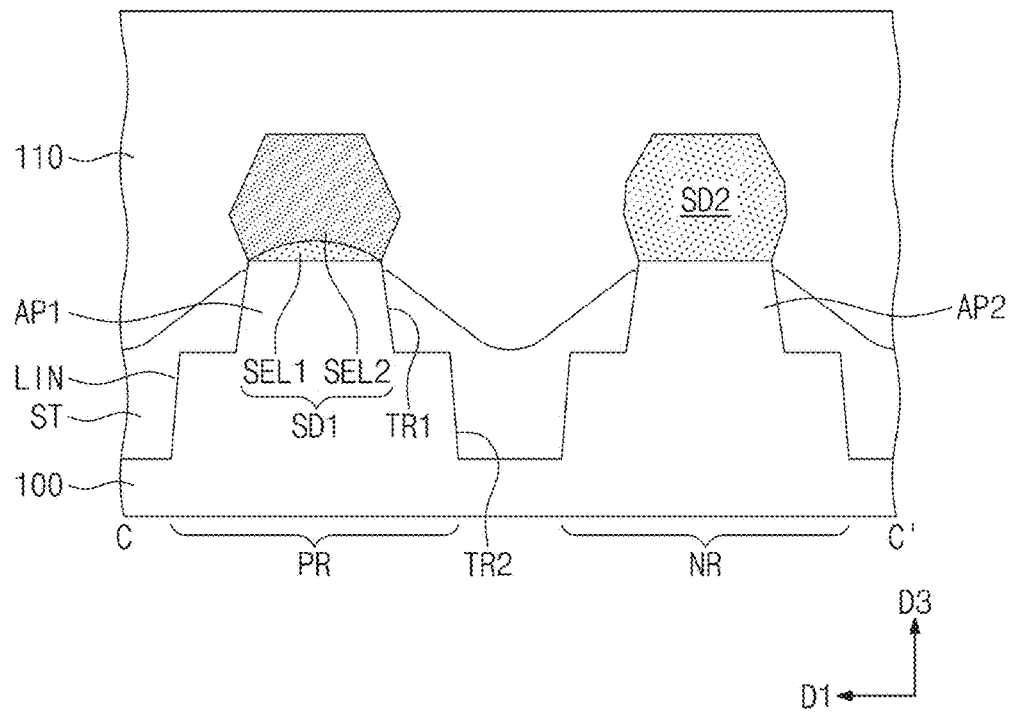
Figure 8D:
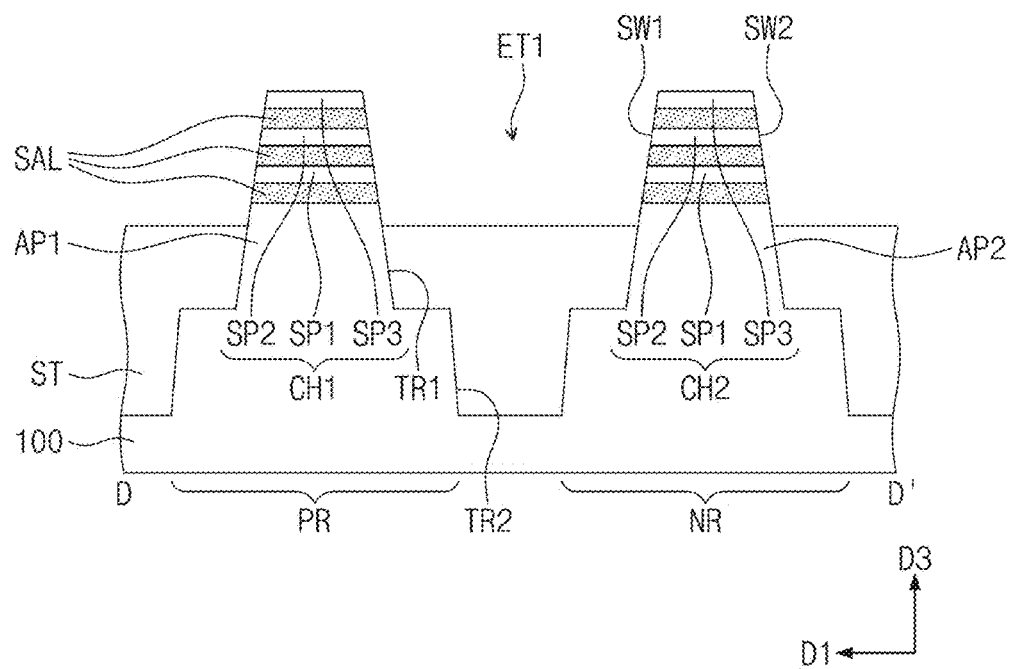
Figure 8E:
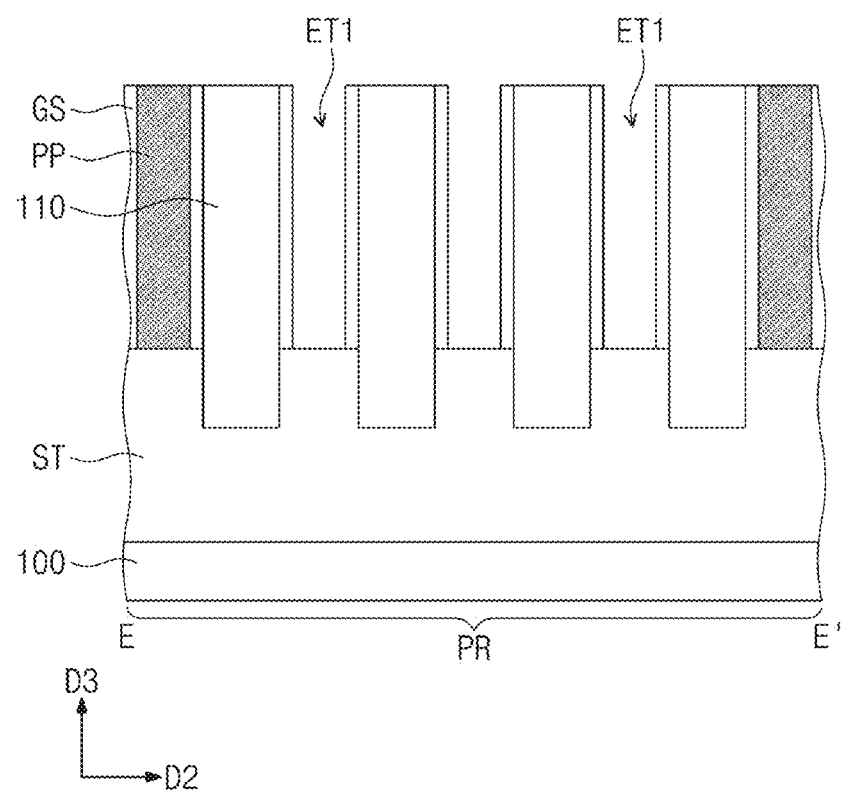
Figure 9A:
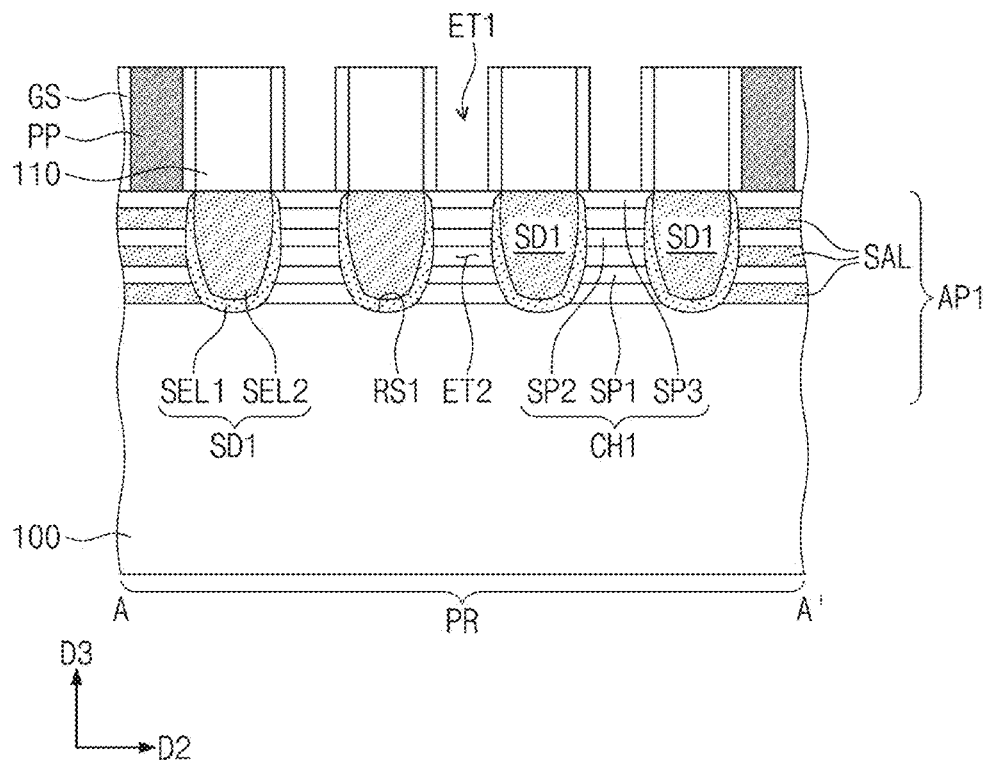
FIGS. 9A to 9D are sectional views corresponding to lines A-A', B-B', C-C' and D-D', respectively, of FIG. 1, illustrating sacrificial layers according to an example embodiment of the inventive concepts.
Figure 9B:
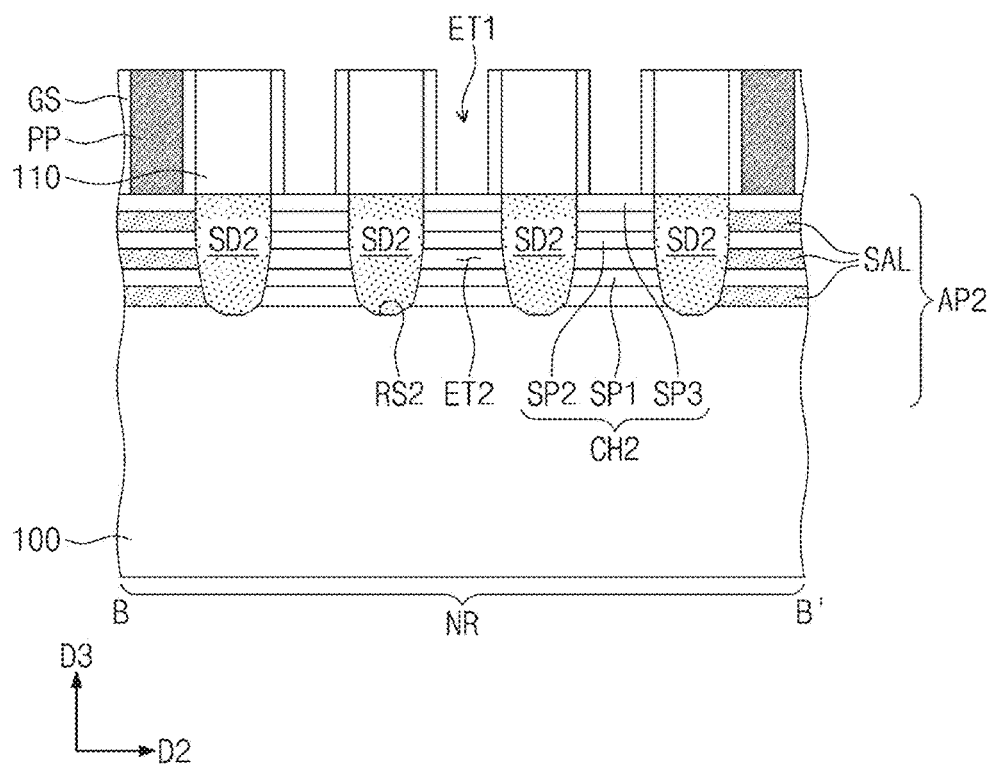
Figure 9C:
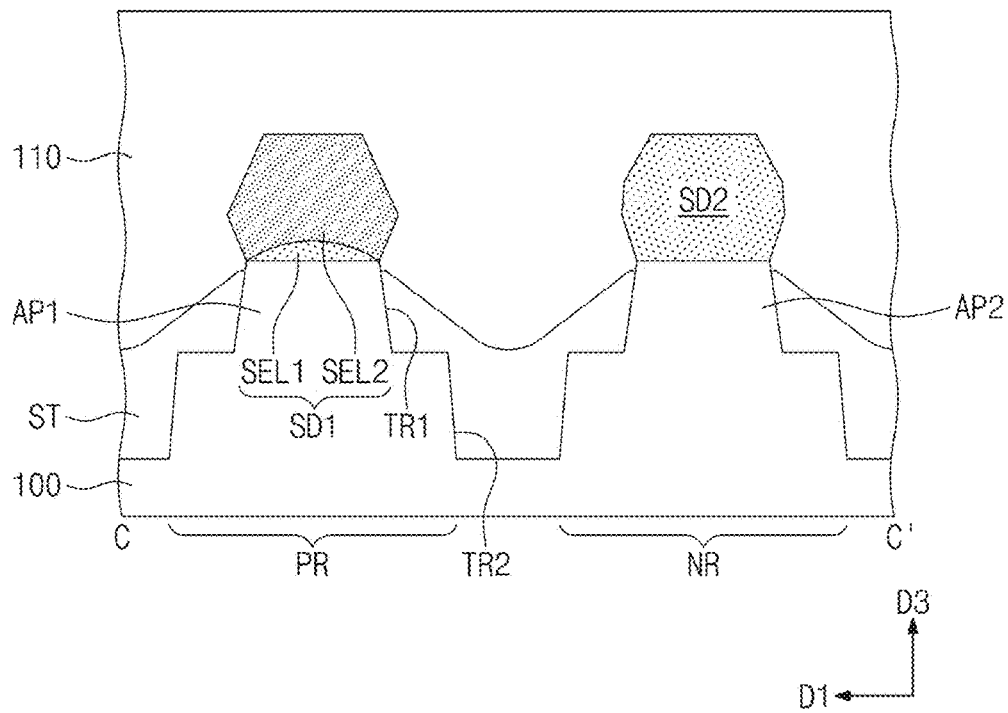
Figure 9D:
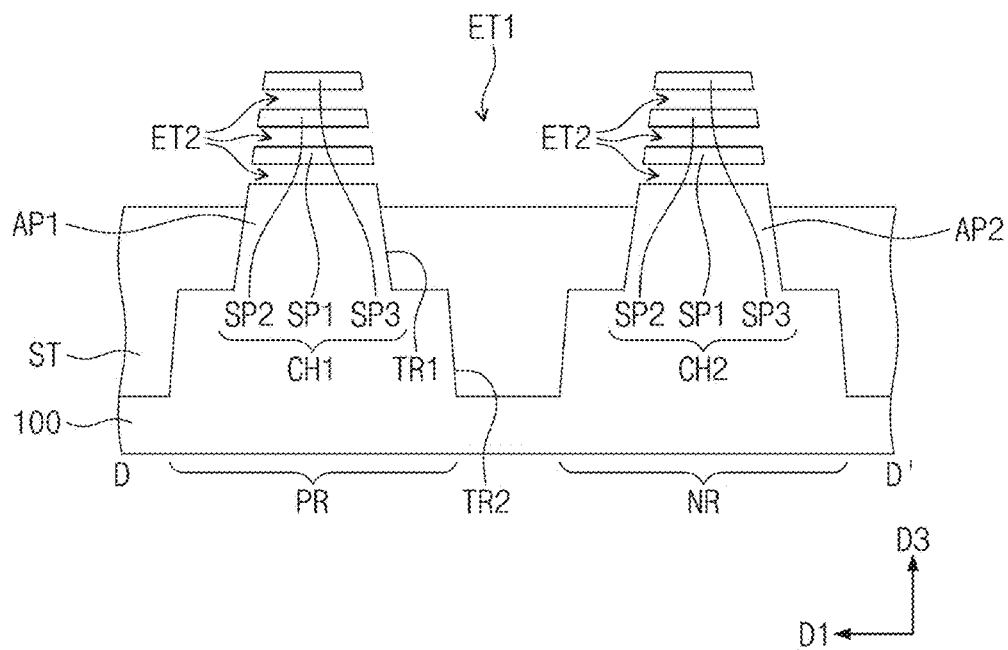
Figure 10A:
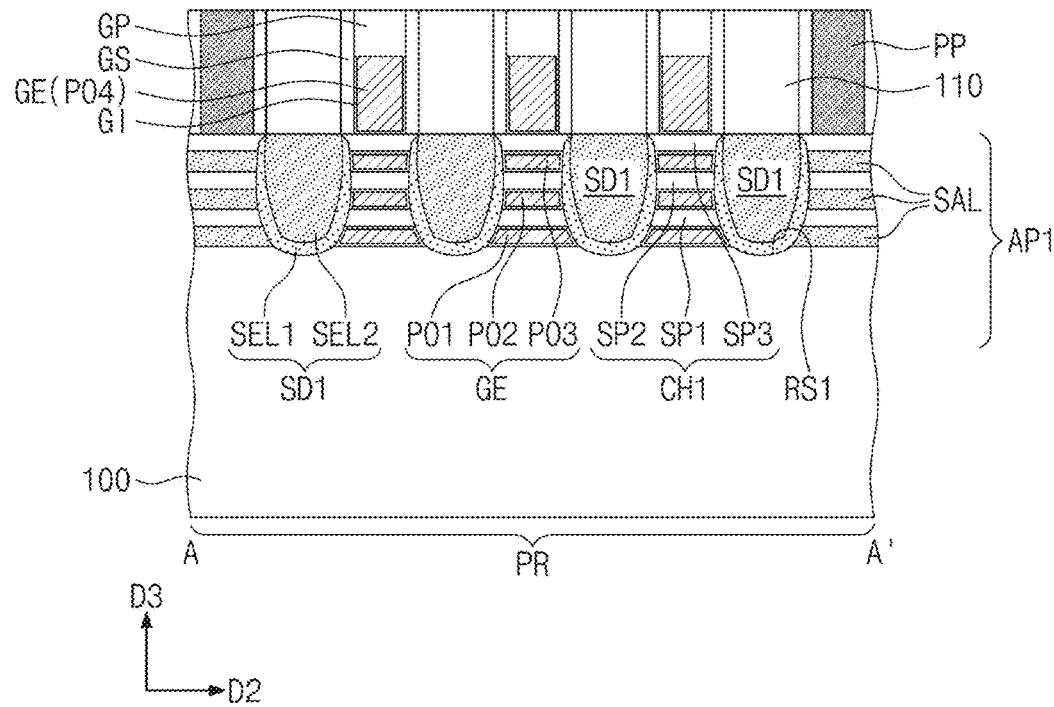
FIGS. 10A to 10E are sectional views corresponding to lines A-A', B-B', C-C' D-D' and E-E', respectively, of FIG. 1, illustrating a gate insulating layer according to an example embodiment of the inventive concepts.
Figure 10B:
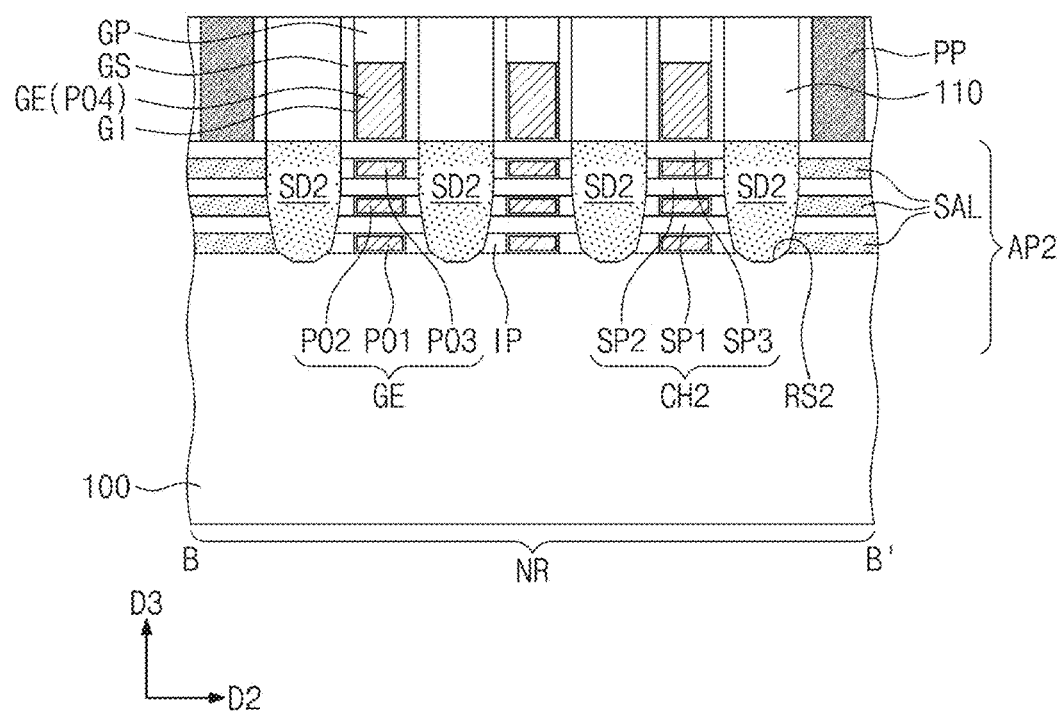
Figure 10C:
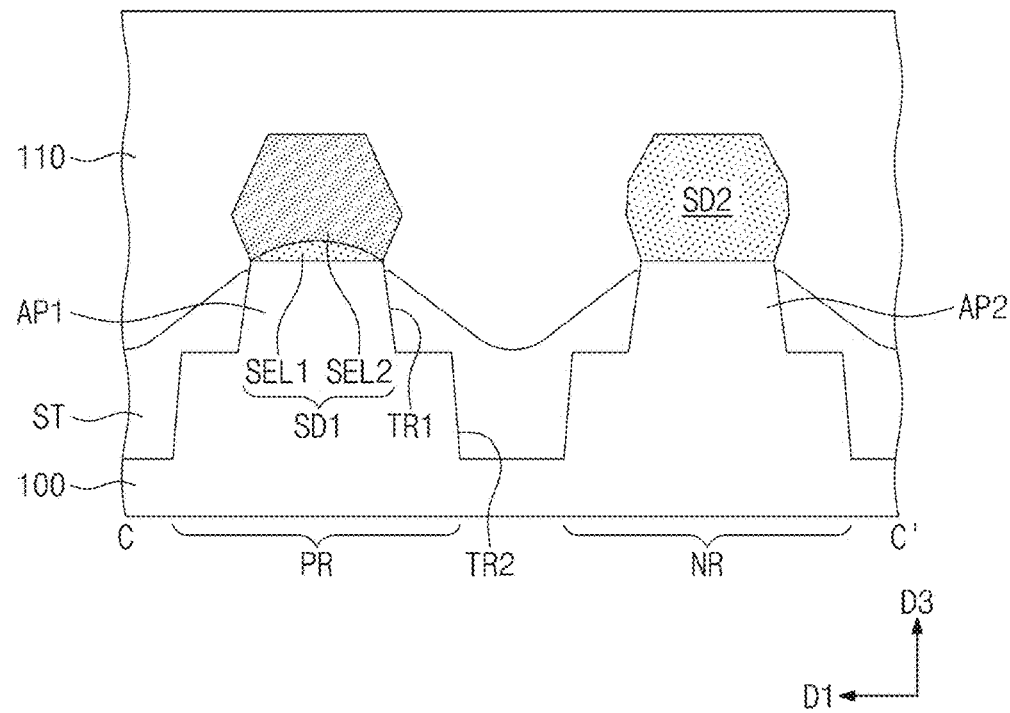
Figure 10D:
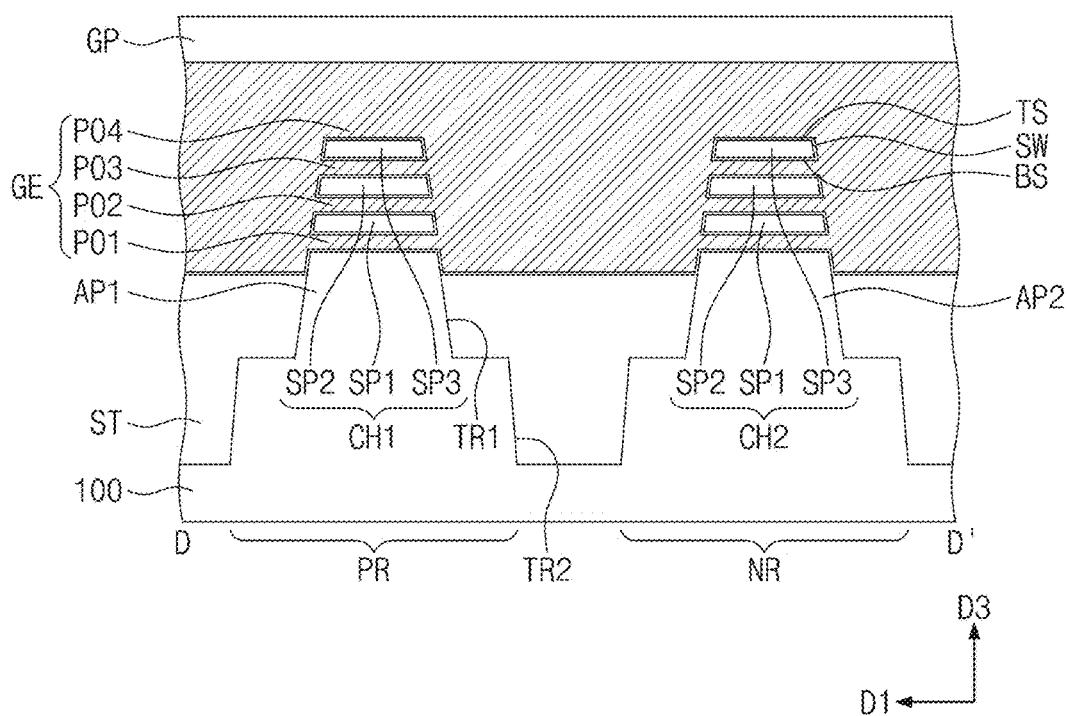
Figure 10E:
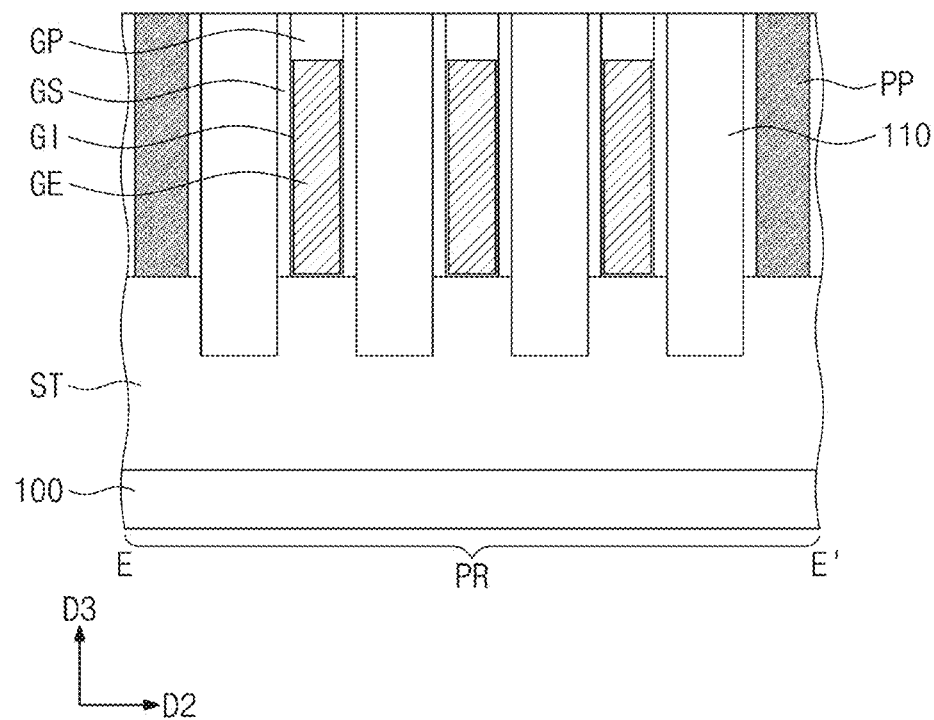
Figure 11A:
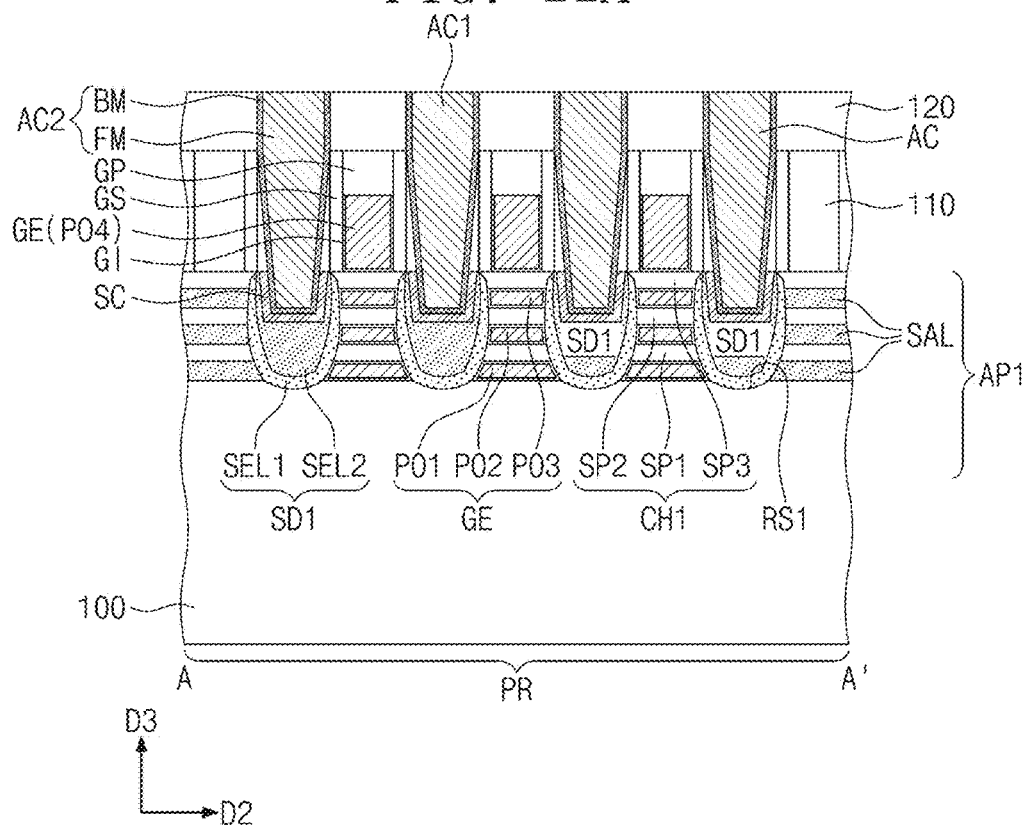
FIGS. 11A to 11E are sectional views corresponding to lines A-A', B-B', C-C' D-D' and E-E', respectively, of FIG. 1, illustrating two interlayer insulating layers according to an example embodiment of the inventive concepts.
Figure 11B:
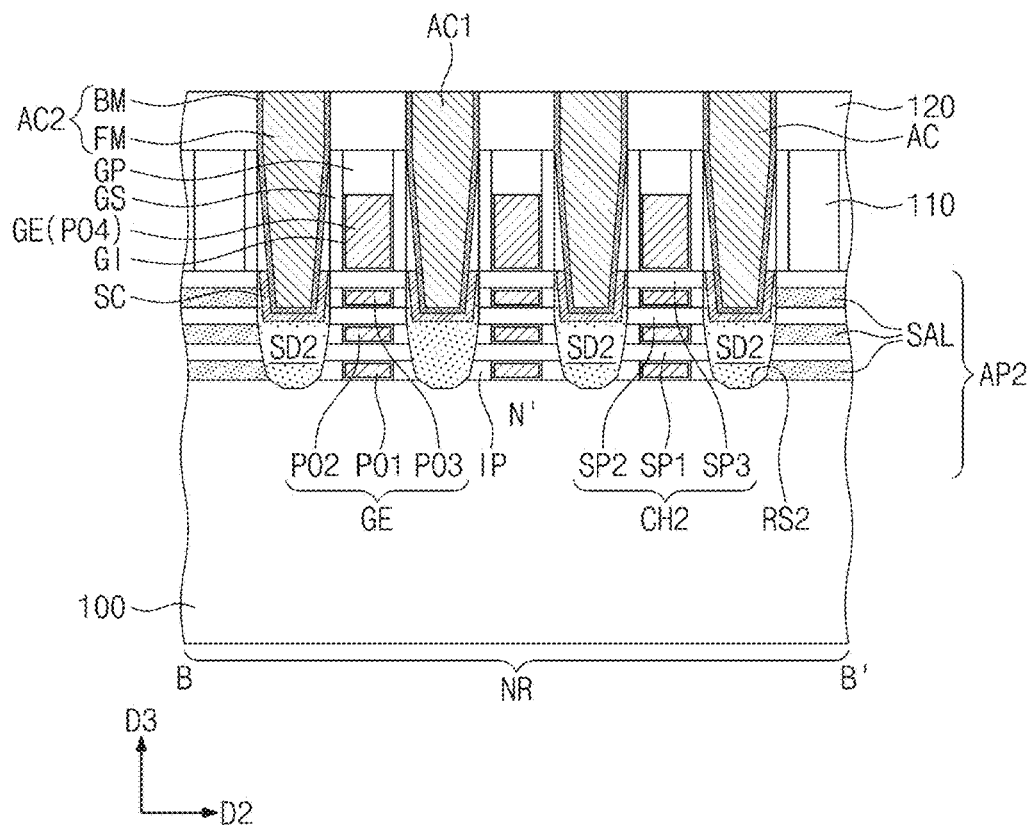
Figure 11C:
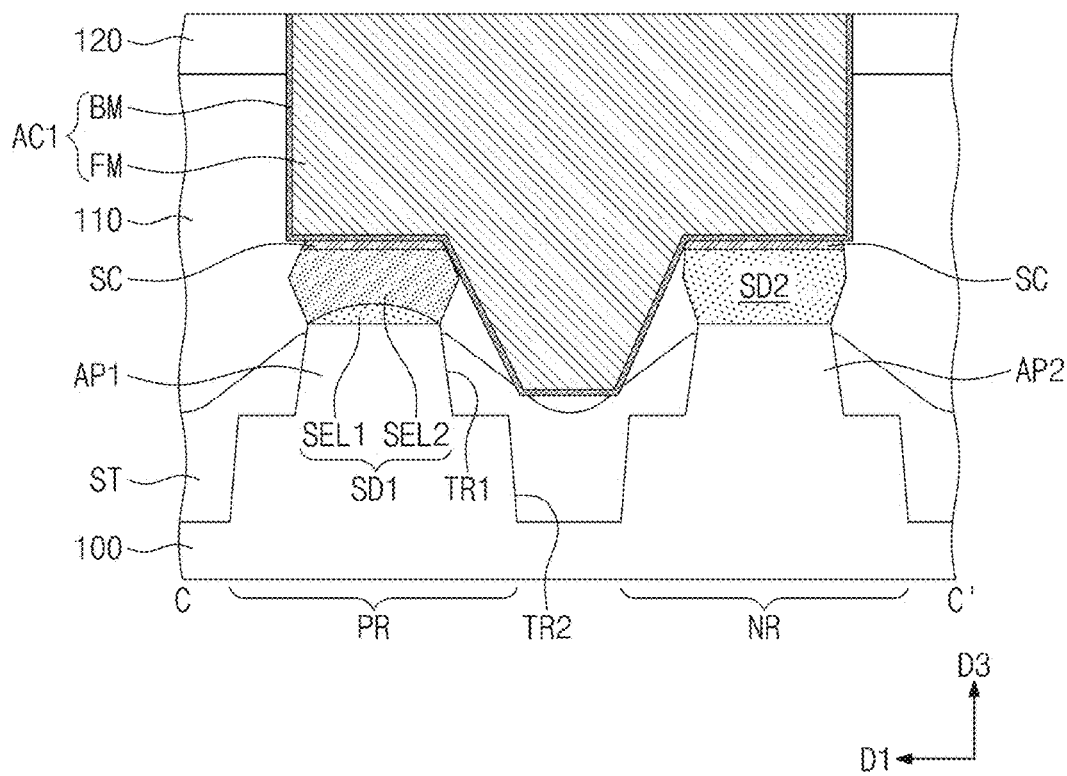
Figure 11D:
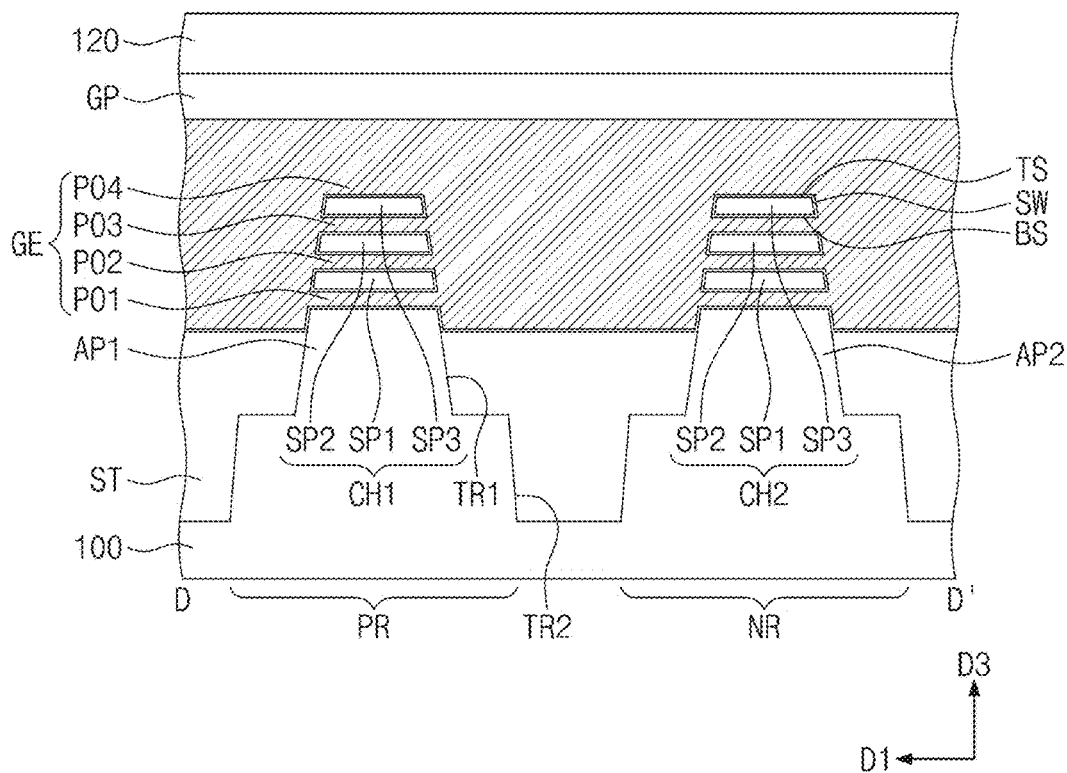
Figure 11E:
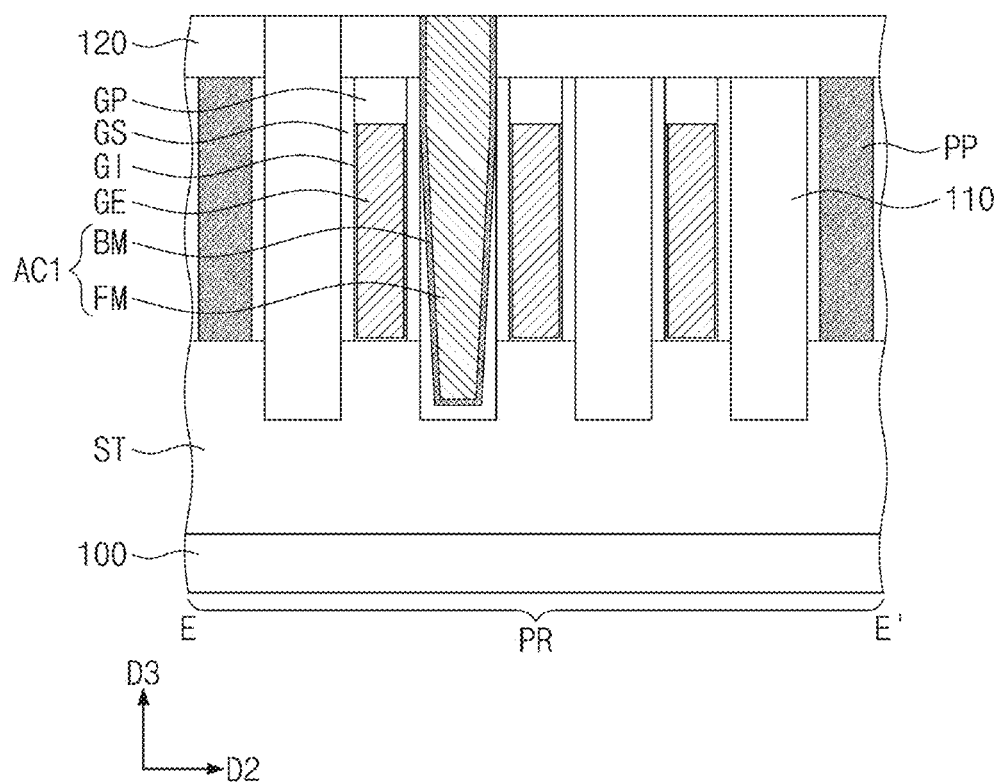

Referring to FIGS. 5A to 5C, sacrificial patterns PP may be formed on the substrate 100 to cross the first and second active patterns AP1 and AP2. Each of the sacrificial patterns PP may be a line- or bar-shaped pattern extended in the first direction D1. The sacrificial patterns PP may be arranged with a specific pitch in the second direction D2.

The formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include poly silicon.

A pair of the gate spacers GS may be respectively formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN, but example embodiments are not limited thereto. In an example embodiment, the gate spacer layer may be a multi-layered structure which may include at least two of SiCN, SiCON, or SiN.

Referring to FIGS. 6A to 6E, the first recesses RS1 may be formed in an upper portion of the first active pattern AP1, and the second recesses RS2 may be formed in an upper portion of the second active pattern AP2. A third recess RS3 may be formed in a separation region between the first and second regions PR and NR. The third recess RS3 may have a bottom surface, which may be defined by the device isolation layer ST and may be lower than bottom surfaces of the first and second recesses RS1 and RS2.

Referring to FIGS. 7A to 7D, the first source/drain patterns SD1 may be formed in the first recesses RS1, respectively. Specifically, a first selective epitaxial growth (SEG) process, in which an inner surface of the first recess RS1 is used as a seed layer, may be performed to form the first semiconductor layer SEL1. The first semiconductor layer SEL1 may be grown using first to third semiconductor patterns SP1, SP2, and SP3 and the substrate 100, which may be exposed through the first recesses RS1, as a seed. In an example embodiment, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In another example embodiment, the first semiconductor layer SEL1 may be provided to contain only silicon (Si) and not germanium (Ge). The germanium concentration of the first semiconductor layer SEL1 may range from 0 at % to 10 at %, but example embodiments are not limited thereto.

The second semiconductor layer SEL2 may be formed by performing a second SEG process on the first semiconductor layer SEL1. The second semiconductor layer SEL2 may be formed to fully fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. The first source/drain pattern SD1 may be doped with impurities after the formation of the first source/drain pattern SD1. The first source/drain pattern SD1 may be doped to have a first conductivity type (e.g., p-type).

The second source/drain patterns SD2 may be formed in the second recesses RS2, respectively. The second source/drain pattern SD2 may be formed by a SEG process, in which an inner surface of the second recess RS2 is used as a seed layer. In an example embodiment, the second source/drain pattern SD2 may be formed of or include the same or substantially the same semiconductor material (e.g., Si) as the substrate 100. The second source/drain pattern SD2 may be doped to have the second conductivity type (e.g., n-type).

Referring to FIGS. 8A to 8E, the first interlayer insulating layer 110 may be formed to cover the first and second source/drain patterns SD1 and SD2, the hard mask patterns MP, and the gate spacers GS. In an example embodiment, the first interlayer insulating layer 110 may be formed of or include silicon oxide. The first interlayer insulating layer 110 may be planarized to expose the top surfaces of the sacrificial patterns PP. The planarization of the first interlayer insulating layer 110 may be performed using an etch-back or chemical mechanical polishing (CMP) process. All of the hard mask patterns MP may be removed during the planarization process. The first interlayer insulating layer 110 may have a top surface that is coplanar or substantially coplanar with the top surfaces of the sacrificial patterns PP and the top surfaces of the gate spacers GS.

The exposed sacrificial patterns PP may be selectively removed. As a result of the removal of the sacrificial pattern PP, upper trenches ET1 may be formed to expose side surfaces of the sacrificial layers SAL. Some of the sacrificial patterns PP may not be removed. For example, the sacrificial pattern PP located on a cell boundary may not be removed. In detail, by forming a mask layer on the sacrificial patterns PP that should not be removed, it may be possible to mitigate or prevent such sacrificial patterns PP from being removed.

Referring to FIGS. 9A to 9D, the sacrificial layers SAL may be selectively removed from the first and second regions PR and NR exposed through the upper trenches ET1. An etching process of selectively etching only the sacrificial layers SAL may be performed to remove only the sacrificial layers SAL and to leave the first to third semiconductor patterns SP1, SP2, and SP3. Since the sacrificial layers SAL are selectively removed, only the first to third semiconductor patterns SP1, SP2, and SP3 may be left on each of the first and second active patterns AP1 and AP2. Hereinafter, empty regions, which may be formed by removing the sacrificial layers SAL, may be referred to as lower trenches ET2. The lower trenches ET2 may be defined between the first to third semiconductor patterns SP1, SP2, and SP3.

Referring to FIGS. 10A to 10E, the gate insulating layer GI may be formed to conformally cover the upper trenches ET1 and the lower trenches ET2. The gate electrode GE may be formed on the gate insulating layer GI. The gate electrode GE may be formed to fill the upper trenches ET1 and the lower trenches ET2. In an example embodiment, the gate electrode GE may include the first to third portions P01, P02, and P03, which may be formed to fill the lower trenches ET2. The gate electrode GE may include the fourth portion P04, which may be formed to fill the upper trench ET1. The gate capping pattern GP may be formed on the gate electrode GE.

Referring to FIGS. 11A to 11E, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The active contacts AC may include the first active contact AC1 and the second active contact AC2. The second active contact AC2 may be a contact that is locally formed on a single source/drain pattern. For example, the second active contact AC2 may be locally provided on one of the first and second source/drain patterns SD1 and SD2. The first active contact AC1 may be a contact that is connected in common to a plurality of source/drain patterns.

Figure 12A:
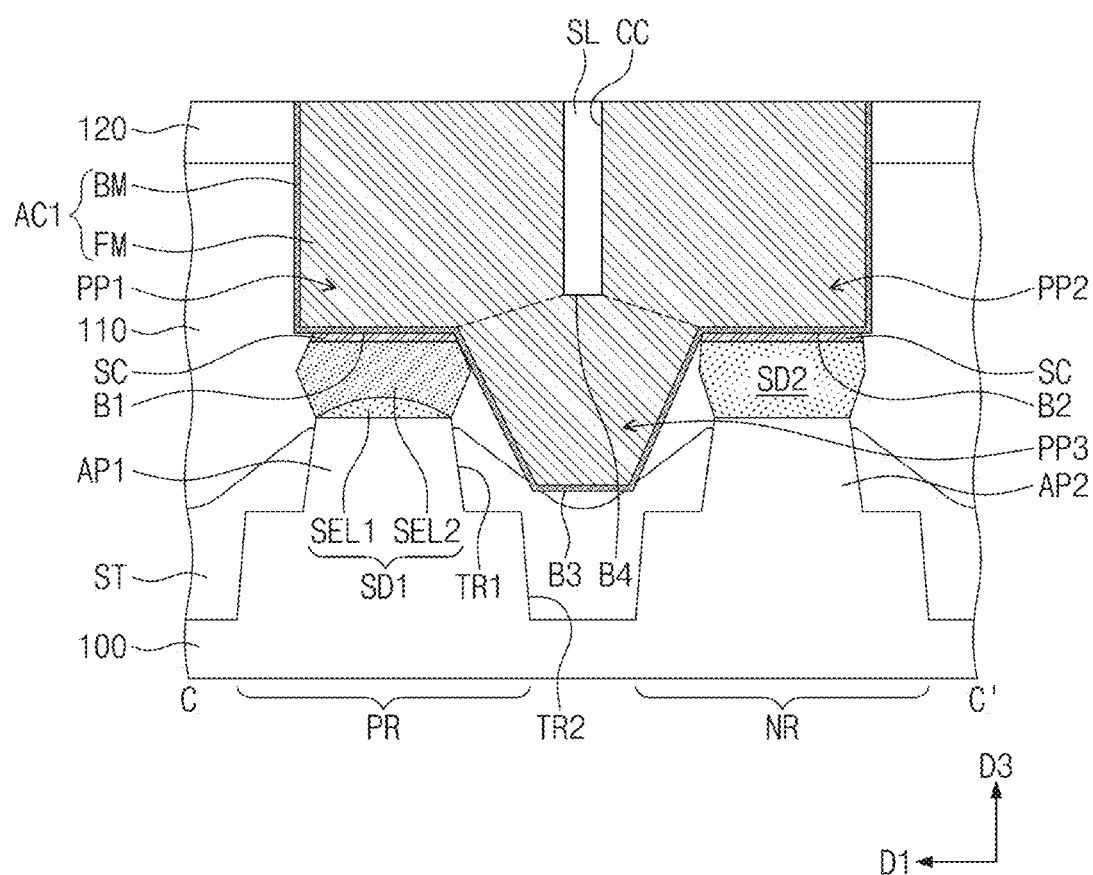
FIGS. 12A to 12C are sectional views corresponding to lines C-C', D-D' and E-E', respectively, of FIG. 1, illustrating an insulating separation pattern according to an example embodiment of the inventive concepts.
Figure 12B:
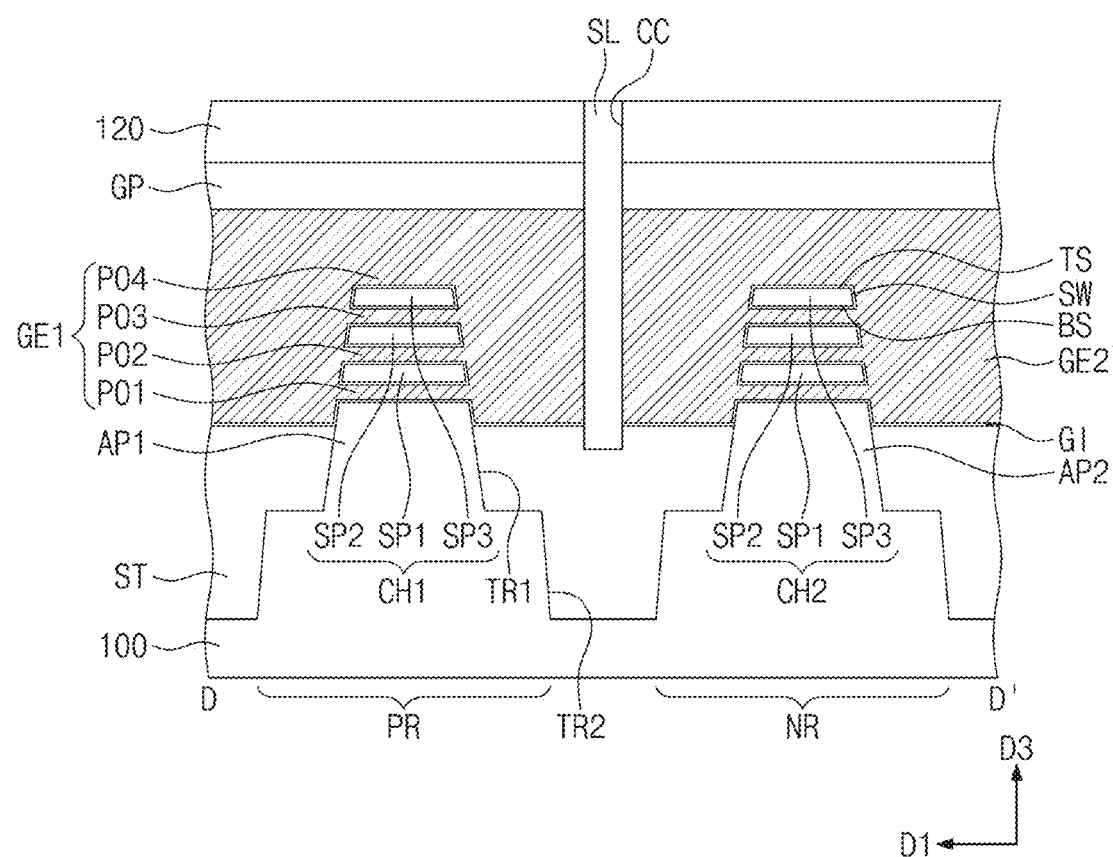
Figure 12C:
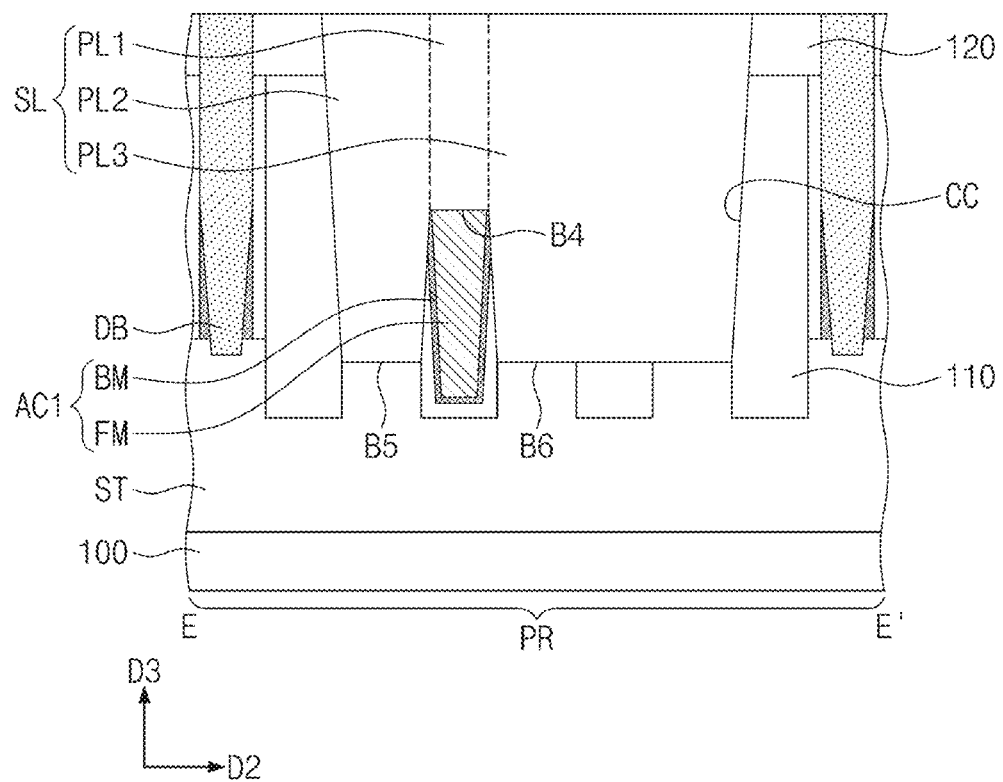

Referring to FIGS. 12A to 12C, the insulating separation pattern SL may extend or be formed to extend in the second direction D2 and divide each of the gate electrodes GE into the first and second gate electrodes GE1 and GE2. The separation trench CC may penetrate or be formed to penetrate each of the gate electrodes GE. The separation trench CC may be extended in the second direction D2 to divide each of the gate electrodes GE into two portions. When the separation trench CC is formed, each of the gate electrodes GE may be divided into two portions, which are spaced apart (e.g., completely spaced apart) from each other in the first direction D1. Due to the third portion PP3 being thicker than the first and second portions PP1 and PP2, the first active contact AC1 may not be divided into two portions, which are spaced apart from each other in the first direction D1. As a result, a bottom surface of the insulating separation pattern SL formed in the separation trench CC may have a shape shown in FIG. 12C. The insulating separation pattern SL may be formed of or include at least one of SiON, SiCN, SiCON, or SiN, but example embodiments are not limited thereto.

Referring back to FIGS. 1 and 2A to 2D, the gate contact GC may penetrate or be formed to penetrate the second interlayer insulating layer 120 and the gate capping pattern GP, and to electrically connected to the gate electrode GE.

A pair of the division structures DB may be formed at both sides of the logic cell LC. In an example embodiment, the division structure DB may penetrate or be formed to penetrate the second interlayer insulating layer 120, the remaining portion of the sacrificial pattern PP, and an upper portion of the active pattern AP1 or AP2 below the sacrificial pattern PP. The division structure DB may be formed of or include at least one of insulating materials (e.g., silicon oxide or silicon nitride). An upper portion of each of the active contacts AC adjacent to the gate contact GC may be removed and then may be filled with the upper insulating pattern UIP.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

A process of forming the first active contact AC1 may be performed after the formation of the insulating separation pattern SL filling the separation trench CC (e.g., when the separation of the gate electrode by the separation trench CC is performed before the formation of the first active contact AC1). In some example embodiments, when a recess is formed to form the first active contact AC1, the insulating separation pattern SL may cause a problem in a process of forming the recess, and as a result, the first active contact AC1 connecting the first and second source/drain patterns SD1 and SD2 may have a problem. For example, there may be a difficulty in electrically connecting the first portion PP1 of the first active contact AC1 on the first source/drain pattern SD1 to the second portion PP2 on the second source/drain pattern SD2.

According to another example embodiment of the inventive concepts, the separation trench CC for the separation of the gate electrode may be formed after the formation of the first active contact AC1. In some example embodiments, the first and second portions PP1 and PP2 may be connected to each other by the third portion PP3 of the first active contact AC1, and thus, it may be possible to overcome the separation issue of the first and second portions PP1 and PP2 described above and thereby to realize a semiconductor device with improved reliability.

In a semiconductor device according to an example embodiment of the inventive concepts, a separation trench dividing a gate electrode into two portions may be formed after forming a first active contact. First and second portions of the first active contact may be connected to each other by a third portion of the first active contact, and it may be possible to mitigate or prevent the first and second portions from being separated from each other. This may make it possible to improve reliability of the semiconductor device.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While some example embodiments of the inventive concepts have been shown and described, it will be understood by one of ordinary skill in the art that variations in form and detail may be made therein without departing from the spirit and scope of the attached claims.

What is claimed is:

1. A semiconductor device, comprising:
a first gate electrode and a second gate electrode each on a substrate, wherein the first gate electrode and the second gate electrode extend in a first direction, and there is a space between the first gate electrode and the second gate electrode in the first direction;
a first source/drain pattern, wherein there is a space between the first source/drain pattern and the first gate electrode in a second direction which crosses the first direction;
a second source/drain pattern, wherein there is a space between the second source/drain pattern and the second gate electrode in the second direction;
an active contact which extends in the first direction and is in common connection with a top surface of the first source/drain pattern and a top surface of the second source/drain pattern, the active contact comprising a first portion on the first source/drain pattern and a second portion on the second source/drain pattern; and
an insulating separation pattern which extends in the second direction and separates the first gate electrode from the second gate electrode,
wherein the active contact further comprises
a third portion which extends to a region below a bottom surface of the insulating separation pattern and connects the first portion and the second portion of the active contact to each other.

2. The semiconductor device of claim 1, wherein the bottom surface of the insulating separation pattern is higher than a bottom surface of the first portion of the active contact on the first source/drain pattern and a bottom surface of the second portion of the active contact on the second source/drain pattern.

3. The semiconductor device of claim 1, wherein a bottom surface of the third portion of the active contact is lower than a bottom surface of the first portion of the active contact and a bottom surface of the second portion of the active contact.

4. The semiconductor device of claim 1, wherein a bottom surface of the third portion of the active contact is lower than a bottom surface of the first source/drain pattern and a bottom surface of the second source/drain pattern.

5. The semiconductor device of claim 1, further comprising an interlayer insulating layer which covers a side surface of the active contact,
wherein the insulating separation pattern comprises a material which is different than a material of the interlayer insulating layer.

6. The semiconductor device of claim 5, wherein the insulating separation pattern comprises at least one of SiON, SiCN, SiCON, and SiN.

7. The semiconductor device of claim 1, wherein the insulating separation pattern is in contact with a side surface of the first gate electrode and a side surface of the second gate electrode.

8. The semiconductor device of claim 1, wherein the insulating separation pattern comprises:
a first portion which covers a top surface of the active contact; and
a second portion which extends into a region between the first gate electrode and the second gate electrode,
wherein a bottom surface of the second portion of the insulating separation pattern is lower than a bottom surface of the first portion of the insulating separation pattern.

9. The semiconductor device of claim 8, further comprising a third gate electrode and a fourth gate electrode each on the substrate, wherein the third gate electrode and the fourth gate electrode extend in the first direction, and there is a space between the third gate electrode and the fourth gate electrode in the first direction,
wherein the insulating separation pattern further comprises a third portion which extends into a region between the third gate electrode and the fourth gate electrode,
the first portion of the insulating separation pattern is between the second portion and the third portion of the insulating separation pattern, and
a bottom surface of the third portion of the insulating separation pattern is lower than the bottom surface of the first portion of the insulating separation pattern.

10. The semiconductor device of claim 8, wherein the first portion of the insulating separation pattern overlaps the third portion of the active contact.

11. The semiconductor device of claim 1, wherein the substrate comprises a PMOSFET region, an NMOSFET region, and a separation region between the PMOSFET region and the NMOSFET region,
the first gate electrode is on the PMOSFET region,
the second gate electrode is on the NMOSFET region, and
the insulating separation pattern is on the separation region.

12. A semiconductor device, comprising:
a first gate electrode and a second gate electrode each on a substrate, wherein the first gate electrode and the second gate electrode extend in a first direction, the first gate electrode and the second gate electrode are aligned in the first direction, and there is a space between the first gate electrode and the second gate electrode in the first direction;
a first source/drain pattern, wherein there is a space between the first source/drain pattern and the first gate electrode in a second direction which crosses the first direction;
a second source/drain pattern, wherein there is a space between the second source/drain pattern and the second gate electrode in the second direction;
an active contact which extends in the first direction and is connected in common to top surfaces of the first source/drain pattern and the second source/drain pattern; and
an insulating separation pattern which extends in the second direction to separate the first gate electrode from the second gate electrode,
wherein the insulating separation pattern comprises:
a first portion which covers a top surface of the active contact; and
a second portion which extends into a region between the first gate electrode and the second gate electrode, and
wherein a bottom surface of the second portion of the insulating separation pattern is lower than a bottom surface of the first portion of the insulating separation pattern.

13. The semiconductor device of claim 12, further comprising a third gate electrode and a fourth gate electrode each on the substrate, wherein the third gate electrode and the fourth gate electrode extend in the first direction, and there is a space between the third gate electrode and the fourth gate electrode in the first direction,
wherein the insulating separation pattern further comprises a third portion which extends into a region between the third gate electrode and the fourth gate electrode,
the first portion of the insulating separation pattern is between the second portion and the third portion of the insulating separation pattern, and
a bottom surface of the third portion of the insulating separation pattern is lower than the bottom surface of the first portion of the insulating separation pattern.

14. The semiconductor device of claim 12, wherein the active contact comprises:
a first portion on the first source/drain pattern;
a second portion on the second source/drain pattern; and
a third portion which extends to a region below the bottom surface of the first portion of the insulating separation pattern and connects the first portion and the second portion of the active contact to each other.

15. The semiconductor device of claim 14, wherein the first portion of the insulating separation pattern overlaps the third portion of the active contact.

16. The semiconductor device of claim 15, wherein the bottom surface of the first portion of the insulating separation pattern is higher than a bottom surface of the first portion of the active contact on the first source/drain pattern and a bottom surface of the second portion of the active contact on the second source/drain pattern.

17. The semiconductor device of claim 15, wherein a bottom surface of the third portion of the active contact is lower than a bottom surface of the first portion of the active contact and a bottom surface of the second portion of the active contact.

18. A semiconductor device, comprising:
a substrate including a PMOSFET region and an NMOSFET region adjacent to each other in a first direction;
a first active pattern on the PMOSFET region and a second active pattern on the NMOSFET region;
a first source/drain pattern on the first active pattern and a second source/drain pattern on the second active pattern;
a first channel pattern in connection with the first source/drain pattern and a second channel pattern in connection with the second source/drain pattern, each of the first channel pattern and the second channel pattern comprising a first semiconductor pattern, a second semiconductor pattern, and a third semiconductor pattern, in a sequential stack arrangement with a space between each adjacent semiconductor pattern;
a first gate electrode which extends in the first direction to cross the first active pattern, and a second gate electrode which extends in the first direction to cross the second active pattern, each of the first gate electrode and the second gate electrode comprising a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern;
a first gate insulating layer between the first channel pattern and the first gate electrode, and a second gate insulting layer between the second channel pattern and the second gate electrode;
a first gate spacer on a side surface of the first gate electrode, and a second gate spacer on a side surface of the second gate electrode;
a first gate capping pattern on a top surface of the first gate electrode, and a second gate capping pattern on a top surface of the second gate electrode;
a first interlayer insulating layer on the first gate capping pattern and the second gate capping pattern;
an active contact which extends in the first direction and is in common connection with a top surface of the first source/drain pattern and a top surface of the second source/drain pattern, wherein the active contact comprises a first portion on the first source/drain pattern and a second portion on the second source/drain pattern;
an insulating separation pattern which extends in a second direction to separate the first gate electrode from the second gate electrode;
gate contacts which penetrate the first interlayer insulating layer and each couple with at least one of the first gate electrode and the second gate electrode;
a second interlayer insulating layer on the first interlayer insulating layer;
a first metal layer in the second interlayer insulating layer, the first metal layer comprising first interconnection lines each in electrical connection with at least one of the active contact and the gate contacts;
a third interlayer insulating layer on the second interlayer insulating layer; and
a second metal layer in the third interlayer insulating layer, the second metal layer comprising second interconnection lines each in electrical connection with at least one interconnection line of the first interconnection lines,
wherein the active contact comprises
a third portion which extends to a region below a bottom surface of the insulating separation pattern and connects the first portion and the second portion of the active contact to each other.

19. The semiconductor device of claim 18, wherein the bottom surface of the insulating separation pattern is higher than a bottom surface of the first portion of the active contact on the first source/drain pattern and a bottom surface of the second portion of the active contact on the second source/drain pattern.

20. The semiconductor device of claim 18, wherein a bottom surface of the third portion of the active contact is lower than a bottom surface of the first portion of the active contact and a bottom surface of the second portion of the active contact.

* * * * *